US 11,315,822 B2

(12) United States Patent
Yamamoto

(10) Patent No.: US 11,315,822 B2
(45) Date of Patent: Apr. 26, 2022

(54) POROUS CHUCK TABLE

(71) Applicant: DISCO CORPORATION, Tokyo (JP)

(72) Inventor: Setsuo Yamamoto, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 297 days.

(21) Appl. No.: 16/456,083

(22) Filed: Jun. 28, 2019

(65) Prior Publication Data

US 2020/0013664 A1 Jan. 9, 2020

(30) Foreign Application Priority Data

Jul. 9, 2018 (JP) .............................. JP2018-130228

(51) Int. Cl.
*H01L 21/683* (2006.01)
*B25B 11/00* (2006.01)
*H01L 21/67* (2006.01)

(52) U.S. Cl.
CPC ........ *H01L 21/6838* (2013.01); *B25B 11/005* (2013.01); *H01L 21/67092* (2013.01)

(58) Field of Classification Search
CPC ..... B25B 11/00; B25B 11/005; B25B 11/007; B23Q 3/08; B23Q 3/088; H01L 21/6838; H01L 21/67092
USPC ....................................... 269/20, 21, 35, 559
See application file for complete search history.

(56) References Cited

U.S. PATENT DOCUMENTS

| 4,521,995 A | * | 6/1985 | Sekiya | ................... | B24B 37/30 |
| | | | | | 125/35 |
| 7,654,887 B2 | * | 2/2010 | Ishikawa | ............. | H01L 21/6838 |
| | | | | | 451/388 |
| 2006/0203222 A1 | * | 9/2006 | Ohmiya | ................ | B25B 11/005 |
| | | | | | 355/72 |
| 2015/0122464 A1 | * | 5/2015 | Ito | ........................... | F28D 15/00 |
| | | | | | 165/104.28 |

FOREIGN PATENT DOCUMENTS

JP 2008062476 A 3/2008

* cited by examiner

*Primary Examiner* — Lee D Wilson
*Assistant Examiner* — Alberto Saenz
(74) *Attorney, Agent, or Firm* — Greer Burns & Crain, Ltd.

(57) ABSTRACT

A porous chuck table for holding a plate-like workpiece under suction includes a porous plate having a porous structure, the porous plate having a holding surface for holding the workpiece under suction thereon, and a frame surrounding the porous plate and having a face side lying flush with the holding surface. The porous plate is at least made of spherical glass particles, adjacent ones of the glass particles are partly joined together, and interstices between adjacent ones of the partly joined glass particles function as pores through which a fluid can flow.

23 Claims, 16 Drawing Sheets

S20

S40

S35

POROUS CHUCK TABLE

BACKGROUND OF THE INVENTION

Field of the Invention

The present invention relates to a porous chuck table for attracting a workpiece under suction, a method of manufacturing such a porous chuck table, and a processing apparatus including such a porous chuck table and a processing unit.

Description of the Related Art

There is known a cutting apparatus for holding a plate-like workpiece such as a semiconductor wafer, a ceramics substrate and a resin-packaged substrate, under suction on a chuck table and cutting the workpiece on the chuck table with an annular cutting blade. On the cutting apparatus, while the cutting blade that is rotating at a high speed is caused to cut into the workpiece, the cutting blade and the chuck table are moved relatively to each other to cause the cutting blade to cut the workpiece along the path of relative movement of the cutting blade and the chuck table. There also known a grinding apparatus for grinding a workpiece held under suction on a chuck table with a grinding wheel. The grinding wheel is disposed above the chuck table, and grinding stones are fixed to a lower surface of the grinding wheel. While the chuck table and the grinding wheel are rotating in the same direction respectively about their own axes, the grinding wheel is lowered to press the grinding stones against the workpiece to grind the workpiece, thereby reducing the thickness of the workpiece.

Furthermore, there is also known a laser processing apparatus for forming modified layers in a workpiece by applying a laser beam that is transmittable through the workpiece, i.e., that has a wavelength transmittable through the workpiece, to the workpiece along projected dicing lines thereon while positioning the focal point of the laser beam within the workpiece. The modified layers are formed in the workpiece along the projected dicing lines by moving the workpiece, which has been attracted under suction to a chuck table, and the laser beam relatively to each other along the projected dicing lines. In the workpiece, cracks extend from the modified layers toward the surface, etc. of the workpiece. As described above, chuck tables are used in cutting apparatus, grinding apparatus, laser processing apparatus, and so on. A chuck table includes a disk-shaped porous plate for supporting a workpiece on its upper surface that serves as a holding surface and a metal frame surrounding the periphery of the porous plate and having a recess in which the lower surface of the porous plate is supported (see, for example, Japanese Patent Laid-Open No. 2008-62476).

The frame has a flow channel defined therein that is joined to the bottom of the porous plate. A suction unit such as a vacuum pump is connected to the flow channel. When the suction unit develops a negative pressure, the negative pressure acts through the flow channel and the porous plate to attract the workpiece under suction on the holding surface of the porous plate. Generally, a porous plate is manufactured as follows: particles of highly hard ceramics selected from silicon carbide (SiC), alumina ($Al_2O_3$), and so on are placed in the cavity of a mold frame and then sintered. After the sintering process, the sintered mass of ceramics produced as a porous plate has its upper surface polished or ground to form the holding surface of a chuck table that is to be held in contact with a workpiece. Since particles of ceramics are usually fabricated by crushing or otherwise breaking a ceramics material, they are shaped as polyhedral particles having angular edges rather than spherical particles, and are of irregular sizes and shapes. Therefore, in a case where a porous plate is produced from a sintered mass of ceramics particles, the holding surface of the resultant chuck table tends to have surface irregularities.

For grinding flatwise the face side of a porous plate of highly hard ceramics, very strong forces are required as grinding forces. Therefore, the grinding process is not easy to perform. When a porous plate is ground by very strong grinding forces, sintered particles of ceramics of the porous plate may be broken. If sintered particles of ceramics of the porous plate are broken in the grinding process, the holding surface of the resultant chuck table has surface irregularities caused by the broken ceramics particles.

SUMMARY OF THE INVENTION

As described above, in a case where a porous plate is produced from a sintered mass of ceramics particles, surface irregularities are likely to be formed on the holding surface of the resultant chuck table. The holding surface of a chuck table requires flatness. If the holding surface is not flat, then it is difficult for the holding surface to hold a workpiece flatwise. For example, if the holding surface of a chuck table includes a recess, then the reverse side of the workpiece on the holding surface is spaced from the holding surface and floats over the recess. When a force is then applied from the face side to reverse side of the workpiece, as the reverse side of the workpiece is not supported, the reverse side of the workpiece tends to break into fragments, i.e., chippings. In addition, since the particles of ceramics are of irregular sizes, pores that are present between the particles are likely to be of irregular sizes. The irregularly sized pores make suction forces uneven in the holding surface of the chuck table. When the workpiece is diced into chips under the uneven suction forces in the holding surface, the chips are liable to develop corner cracks and chippings on their reverse sides.

The present invention has been made in view of the above problems of the related art. It is an object of the present invention to provide a porous plate manufactured from particles of a material that is different from those used hereinbefore.

In accordance with an aspect of the present invention, there is provided a porous chuck table for holding a plate-like workpiece under suction, including: a porous plate having a porous structure, the porous plate having a holding surface for holding the workpiece under suction thereon; and a frame surrounding the porous plate and having a face side lying flush with the holding surface; in which the porous plate is at least made of spherical glass particles, adjacent ones of the glass particles are partly joined together, and interstices between adjacent ones of the partly joined glass particles function as pores through which a fluid can flow.

Preferably, the holding surface of the porous plate is flat.

Preferably, the glass particles have particle diameters selected in a predetermined range from 3 µm to 4 mm.

Preferably, the frame is made of glass.

Preferably, porosity of the porous plate represented by a ratio of a volume of the pores to the volume of the porous plate is in a range from 5% to 40%.

In accordance with another aspect of the present invention, there is provided a method of manufacturing a porous chuck table, including the steps of filling a mold frame with spherical glass particles having particle diameters selected in a predetermined range from 3 μm to 4 mm, sintering the glass particles that have filled the mold frame to partly join adjacent ones of the glass particles together, thereby producing a porous plate, and grinding a face side of the porous plate fixedly fitted in a frame which is of a shape surrounding the porous plate, together with a face side of the frame, thereby planarizing the face side of the porous plate, in which the step of sintering the glass particles is finished while interstices are being left between the glass particles in the porous plate, so that the interstices function as pores through which a fluid can flow.

Preferably, in the step of sintering the glass particles, the porosity of the porous plate represented by the ratio of the volume of the pores to the volume of the porous plate is adjusted by at least one of sintering temperature, sintering time, and pressure applied to the glass particles.

Preferably, the step of filling the mold frame includes the step of filling the mold frame with a mixture of the glass particles and frit smaller in diameter than the glass particles.

In accordance with still another aspect of the present invention, there is provided a processing apparatus comprising: a porous chuck table including a porous plate having a porous structure, the porous plate having a holding surface for holding a workpiece under suction thereon, and a frame surrounding the porous plate and having a face side lying flush with the holding surface, in which the porous plate is at least made of spherical glass particles, adjacent ones of the glass particles are partly joined together, and interstices between adjacent ones of the partly joined glass particles function as pores through which a fluid can flow, and a processing unit processing the workpiece held on the porous chuck table.

Preferably, the processing unit is a cutting unit cutting the workpiece held on the porous chuck table with a cutting blade.

Preferably, the processing unit is a laser beam applying unit applying a laser beam to the workpiece held on the porous chuck table to process the workpiece.

Preferably, the processing unit is a grinding unit grinding the workpiece held on the porous chuck table with a grinding stone.

The porous plate of the porous chuck table according to the present invention is made of glass particles that are less hard than ceramic particles. Therefore, the face side of the porous plate can be ground with a force weaker than if the porous plate were made of ceramic particles. Furthermore, the porous plate according to the present invention is made of glass particles that are high in particle diameter uniformity and nearly spherical compared to ceramics particles. Consequently, the uniformity of the sizes of pores defined as interstices between the glass particles is higher compared to the uniformity of the sizes of pores in porous plates made of ceramics particles. Since the highly uniform pores are not only present in the porous plate, but also exposed on the holding surface of the porous plate, the porous plate made of the glass particles makes it possible to uniformize a suction force in the holding surface compared to porous plates made of ceramics particles.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
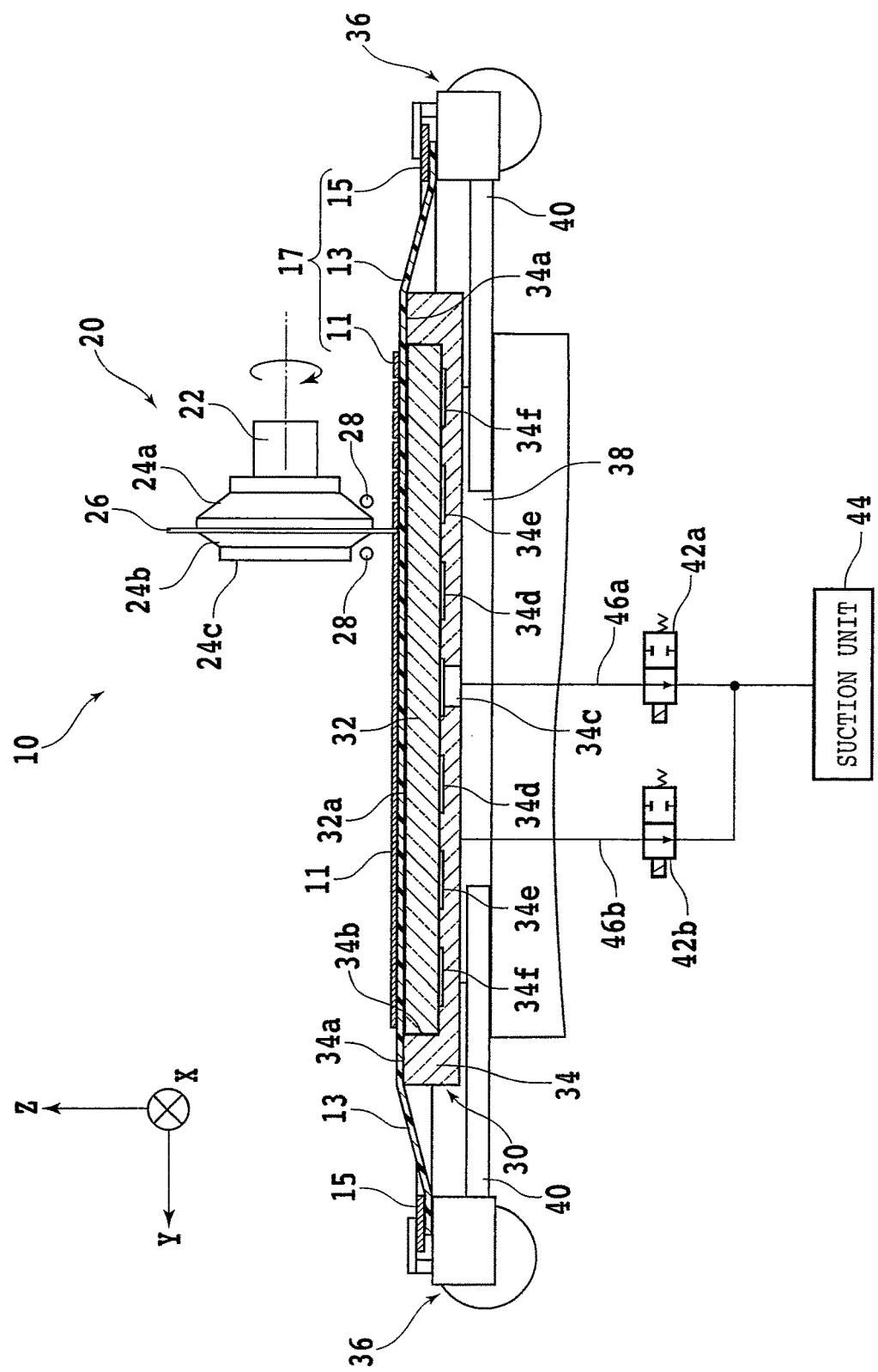
FIG. 1 is a side elevational view, partly in cross section, of a processing apparatus according to a first embodiment of the present invention.

Embodiments of the present invention will hereinafter be described below with reference to the accompanying drawings. FIG. 1 is a side elevational view, partly in cross section, of a processing apparatus 10 according to a first embodiment of the present invention. In the drawings, some components are illustrated in simplified forms including lines, blocks, symbols, etc. For example, valves 42a, 42b and a suction unit 44 to be described later are illustrated in simplified forms in FIG. 1. The processing apparatus 10 according to the first embodiment includes a porous chuck table 30 for holding a plate-like workpiece 11 thereon under a suction force or negative pressure applied from a suction unit 44 to the porous chuck table 30 as described later. The porous chuck table 30 has a substantially disk-shaped frame 34 mounted on an upper portion of a table base 38. The frame 34 is made of a material selected from various types of glass including soda glass, borosilicate glass, quartz glass, etc. The processing apparatus 10 according to the first embodiment is a cutting apparatus. Unless the processing apparatus 10 is a laser processing apparatus, the frame 34 may be made of metal or ceramics.

The frame 34 has a disk-shaped recess 34b defined therein that has a diameter smaller than the frame 34. The recess 34b has a predetermined depth from a face side 34a of the frame 34. The frame 34 also has a flow channel 34c of a cylindrical shape defined therein at the center of the recess 34b and extending therethrough from the bottom surface of the recess 34b to the reverse side of the frame 34. The bottom surface of the recess 34b has an annular flow channel 34d defined therein that extends around the flow channel 34c and that is shallower than the flow channel 34c. The bottom surface of the recess 34b also has an annular flow channel 34e defined therein that is disposed outwardly of the annular flow channel 34d concentrically thereto, and another annular flow channel 34f defined therein that is disposed outwardly of the annular flow channel 34e concentrically thereto. The flow channels 34e and 34f have respective depths equal to the depth of the flow channel 34d. The bottom surface of the recess 34b further has a groove, not illustrated, defined therein that extends across the flow channels 34d, 34e and 34f as viewed in plan. The groove is of a criss-cross shape whose center is located at the flow channel 34c. The flow channels 34c, 34d, 34e and 34f are interconnected by the criss-cross groove.

The porous chuck table 30 also includes a disk-shaped porous plate 32 having a porous structure that is fixedly fitted in the recess 34b in the frame 34. The porous plate 32 has a holding surface 32a facing upwardly and a reverse side of the porous plate 32 held in contact with the bottom surface of the recess 34b and respective upper ends of the flow channels 34d, 34e and 34f. The porous plate 32 and the bottom and side surfaces of the recess 34b are secured to each other by an adhesive of epoxy resin or the like against movement relative to each other. The porous plate 32 according to the present embodiment is made of glass particles of soda glass (also called "soda lime glass"), borosilicate glass, or the like, rather than ceramics such as silicon carbide and alumina. Since quartz glass is harder and more difficult to process than soda glass, borosilicate glass, or the like, the material of the porous plate 32 should more preferably be soda glass, borosilicate glass, or the like than quartz glass. Glass particles for use as the material of the porous plate 32 are spherical in shape and uniform in diameter, they should preferably be free of air bubbles and be dense therein.

The glass particles may be fabricated by a spray drying process. A spray drier used in the spray drying process has a nozzle or disk for pulverizing a raw material of glass. The raw material of glass is pulverized under surface tension or the like by the spray drier and then exposed to hot air supplied to a drying chamber, whereupon the pulverized glass is solidified into spherical glass particles that are uniform in diameter. According to the present embodiment, the glass particles have particle diameters selected in a predetermined range from 3 to 4 mm. Preferably, the glass particles have particle diameters selected from 5 μm to 300 μm, and more preferably the glass particles have particle diameters selected from 30 to 200 μm. The particle diameters of the glass particles vary according to the Gaussian distribution. If the particle diameters of the glass particles are of values equal to or smaller than 100 μm, for example, then a group of glass particles whose diameters have a standard deviation of 5 μm or less is used as the material of the porous plate 32. If the particle diameters of the glass particles are of values ranging from 101 μm to 300 μm, then a group of glass particles whose diameters have a standard deviation of 10 μm or less is used as the material of the porous plate 32.

In the porous plate 32 according to the present embodiments, adjacent ones of the spherical glass particles are partly joined together. Interstices between adjacent ones of the partly joined glass particles function as pores through which a fluid can flow. The ratio of the volume of pores to the volume of the porous plate 32 is herein referred to as a porosity. The porosity of the porous plate 32 is in a range from 5% to 40%, for example. The porosity of the porous plate 32 can be adjusted depending on the suction force acting on the porous chuck table 30 to be manufactured. The porosity of the porous plate 32 according to the present embodiment is in a range from 30% to 40%, for example. However, the porosity of the porous plate 32 may range from 5% to 20% or 20% to 30% according to other embodiments. The porosity can be adjusted by varying the pressure, time, temperature, the amount of frit added to the glass particles, etc. at the time the glass particles are sintered, as described in detail later. Providing the suction unit 44 that is held in fluid communication with the porous plate 32 has a predetermined evacuating rate, the attractive force generated by the porous plate 32 under the suction force from the suction unit 44 can be made comparatively higher by increasing the porosity of the porous plate 32. The higher suction force can attract a warped and hard workpiece 11 flatwise to the holding surface 32a.

On the other hand, providing the suction unit 44 has a predetermined evacuating rate, the attractive force generated by the porous plate 32 under the suction force from the suction unit 44 can be made comparatively lower by reducing the porosity of the porous plate 32. In addition, the lower the porosity of the porous plate 32 is, the larger the area of contact between the workpiece 11 and the holding surface 32a becomes. As the area of the holding surface 32a that supports the workpiece 11 is larger, the reverse side of the workpiece 11 is less likely to chip off. The porosity of the porous plate 32 can thus be selected depending on the workpiece 11 to be supported thereon. In the porous plate 32, the spherical surfaces of the adjacent glass particles face each other across the interstices therebetween. Therefore, when the suction unit 44 evacuates the porous plate 32, the interstices between the glass particles allow a fluid to flow more smoothly therethrough than the interstices between polyhedral ceramics particles having angular edges. The fluid that flows through pores defined as the interstices between the glass particles is a gas such as air. When the suction unit 44 evacuates the porous plate 32, the suction unit 44 draws in air from the porous plate 32 through the interstices or pores thereof and discharges the drawn air, thereby producing the suction force to act on the porous plate 32.

The sizes of the pores between the glass particles are more uniform than those of pores formed by ceramics particles whose sizes are more irregular than the glass particles. Therefore, the suction force acting on the porous plate 32 is comparatively uniform in the holding surface 32a thereof. Consequently, an even and stable holding force can be generated in the holding surface 32a and applied as the attractive force from the porous plate 32. When the workpiece 11 is subsequently diced into individual chips, the chips are thus prevented from being unduly moved out of place. Therefore, the chips are prevented from suffering corner cracks and chippings on their reverse sides.

The recess 34b in the frame 34 that houses the porous plate 32 therein is of a shape surrounding the porous plate 32. The frame 34 includes an annular wall on an outer circumferential end of the recess 34b in the frame 34. The annular wall has an upper end serving as a surface 34a of the frame 34. The surface 34a lies flush with the holding surface 32a of the porous plate 32, which is flat. In the present description, that the holding surface 32a is flat means that the holding surface 32a has a center-line average roughness Ra of 5.0 µm or less. According to the present embodiment, the holding surface 32a has a center-line average roughness Ra of 4.3 µm over a reference length of approximately 2.4 mm, i.e., the length of a given portion extracted from a profile curve. A porous plate made of ceramics particles manufactured as a comparative porous plate had a center-line average roughness Ra of 5.7 µm over a reference length of approximately 2.5 mm. The flatness of the holding surface 32a may be defined using a maximum height Ry instead of the center-line average roughness Ra. In the present description, that the holding surface 32a is flat may mean that the holding surface 32a has a maximum height Ry of 25 µm or less. According to the present embodiment, the holding surface 32a has a maximum height Ry of 22.1 µm over a reference length of approximately 2.4 mm. A porous plate made of ceramics particles manufactured as a comparative porous plate had a maximum height Ry of 29.6 µm over a reference length of approximately 2.5 mm.

The flatness of the holding surface 32a of the porous plate 32 affects the processing of the workpiece 11. For example, providing the workpiece 11 is diced into small rectangular chips each having sides that are 1 mm or less long, if the ratio of the flat holding surface 32a to the pores is not large, the ratio of the area of the holding surface 32a that supports the reverse side of the workpiece 11 is reduced, making the reverse side of the workpiece 11 more likely to break into chippings. The porous plate 32 according to the present invention is made of glass particles that are less hard than ceramics particles. Therefore, face and reverse sides 32c and 32d of the porous plate 32 according to the present invention can be ground with a force weaker than if the porous plate 32 were made of ceramic particles. When glass particles are ground, their ground surfaces tend to be flat surfaces rather than indeterminate surfaces. Therefore, the holding surface 32a is liable to be flat in its entirety. The holding surface 32a of the porous plate 32 is thus rendered flatter than if the porous plate 32 were made of ceramic particles. Since the holding surface 32a of the porous plate 32 according to the present embodiment is flatter than porous plates made of ceramics particles, the porous plate 32 is suitable for dicing the workpiece 11 into small chips because, for example, it is more effective to prevent the reverse side of the workpiece 11 from breaking into chippings.

The reverse side of the porous plate 32 that is positioned opposite to the holding surface 32a is held in fluid communication with the flow channel 34c or the like. The flow channel 34c is connected to one end of a flow channel 46a defined in the table base 38, etc. that supports the frame 34. The other end of the flow channel 46a is connected to the suction unit 44. The suction unit 44 may be an ejector or a vacuum pump, for example. A valve 42a is connected between the one and other ends of the flow channel 46a.

When the valve 42a is open, the suction force from the suction unit 44 acts through the flow channel 46a and the flow channels 34c, 34d, 34e and 34f on the porous plate 32, attracting and holding under suction the workpiece 11 placed on the holding surface 32a. The frame 34 has a reverse side placed in an opening that is defined in the table base 38 and is open upwardly. The bottom of the opening in the table base 38 is held in fluid communication with one end of a flow channel 46b branched off the flow channel 46a. The other end of the flow channel 46b is connected to the flow channel 46a between the valve 42a and the other end of the flow channel 46a, i.e., between the valve 42a and the suction unit 44.

A valve 42b is connected between the one and other ends of the flow channel 46b, i.e., between the one end of the flow channel 46b and the suction unit 44. When the valve 42b is open, the reverse side of the frame 34 is attracted to and held on the bottom surface of the opening in the table base 38 by the suction force from the suction unit 44. The table base 38 has a plurality of pins 40 projecting horizontally outwardly from side surfaces thereof. According to the present embodiment, specifically, four pairs of pins 40 project from respective four sides of the table base 48 along X- and Y-axis directions that are mutually perpendicular horizontal directions. Clamps 36 are mounted on the outer ends of the pins 40 projecting from the table base 38. When the clamps 36 are actuated, they secure the outer edges of a workpiece unit 17, to be described later, that includes the workpiece 11 as described later. The workpiece 11 may be a disk-shaped wafer made of a semiconductor material such as silicon. The workpiece 11 has a face side demarcated into a plurality of areas by a grid of projected dicing lines or streets, with respective devices such as integrated circuits (ICs) formed respectively in the areas.

The workpiece 11 is not limited to any particular material, shape, structure, size, etc. The workpiece 11 may be a substrate made of a semiconductor material other than described above, ceramics, a resin, a metal, or other materials. Similarly, the devices on the workpiece 11 are not limited to any particular type, number, shape, structure, size, layout, etc. The workpiece 11 may even be free of devices. A dicing tape, i.e., an adhesive tape, 13 that is larger in area than the workpiece 11 is stuck to the reverse side of the workpiece 11. The dicing tape 13, for example, includes a base layer and an adhesive layer applied to the entire surface of the base layer. The adhesive layer, for example, which may be an ultraviolet-curable resin layer, exhibits strong adhesive power with respect to the workpiece 11, etc. The adhesive layer on an outer circumferential portion of the dicing tape 13 is fixed to an annular frame 15. The workpiece 11 is supported on the dicing tape 13 in the opening in the annular frame 15. The workpiece 11, the dicing tape 13, and the annular frame 15 jointly make up the workpiece unit 17 referred to above.

A processing unit is disposed above the workpiece unit 17. The workpiece 11 secured in the workpiece unit 17 is processed by the processing unit. The processing apparatus 10 according to the first embodiment is a cutting apparatus, as described above, that includes a cutting unit 20 as the processing unit processing the workpiece 11. The cutting unit 20 includes a spindle 22 as a rotatable shaft parallel to the Y-axis directions, i.e., indexing-feed directions. The spindle 22 is partly housed in a tubular spindle housing, not illustrated. The spindle 22 is rotatably supported in the spindle housing by an air bearing, not illustrated. The spindle 22 has a one end portion on which a cutting blade 26 is fixedly mounted by mount jigs 24a, 24b and 24c. According to the present embodiment, the cutting blade 26 is a washer-type blade. However, the cutting blade 26 may be a hub-type blade.

A rotary actuator, not illustrated, such as an electric motor, is disposed at the other end of the spindle 22 that is opposite to the one end portion thereof on which the cutting blade 26 is mounted. The rotary actuator is coupled to the other end of the spindle 22 for rotating the spindle 22 about its own axis at a high speed. While the spindle 22 and hence the cutting blade 26 are being rotated by the rotary actuator, the cutting blade 26 is caused to cut into the workpiece 11 and the cutting blade 26 and the porous chuck table 30 are moved relatively to each other along one of the X-axis directions to cut the workpiece 11 along the path in which the cutting blade 26 and the porous chuck table 30 are moved relatively to each other. The cutting unit 20 also includes a pair of cutting fluid supply nozzles 28 disposed one on each side of the cutting blade 26 and parallel to each other in the Y-axis directions. The cutting fluid supply nozzles 28 have respective pipes extending along the X-axis directions, i.e., processing-feed directions. The pipes each have a plurality of ejection ports directed toward the cutting blade 26. When the workpiece 11 is cut by the cutting blade 26, the ejection ports supply a cutting fluid such as pure water to the cutting blade 26. The supplied cutting fluid reaches a point where the cutting blade 26 and the workpiece 11 contact each other, i.e., a processing point, along the cutting blade 26 or directly from the ejection ports, thereby cooling the cutting point.

Figure 2:
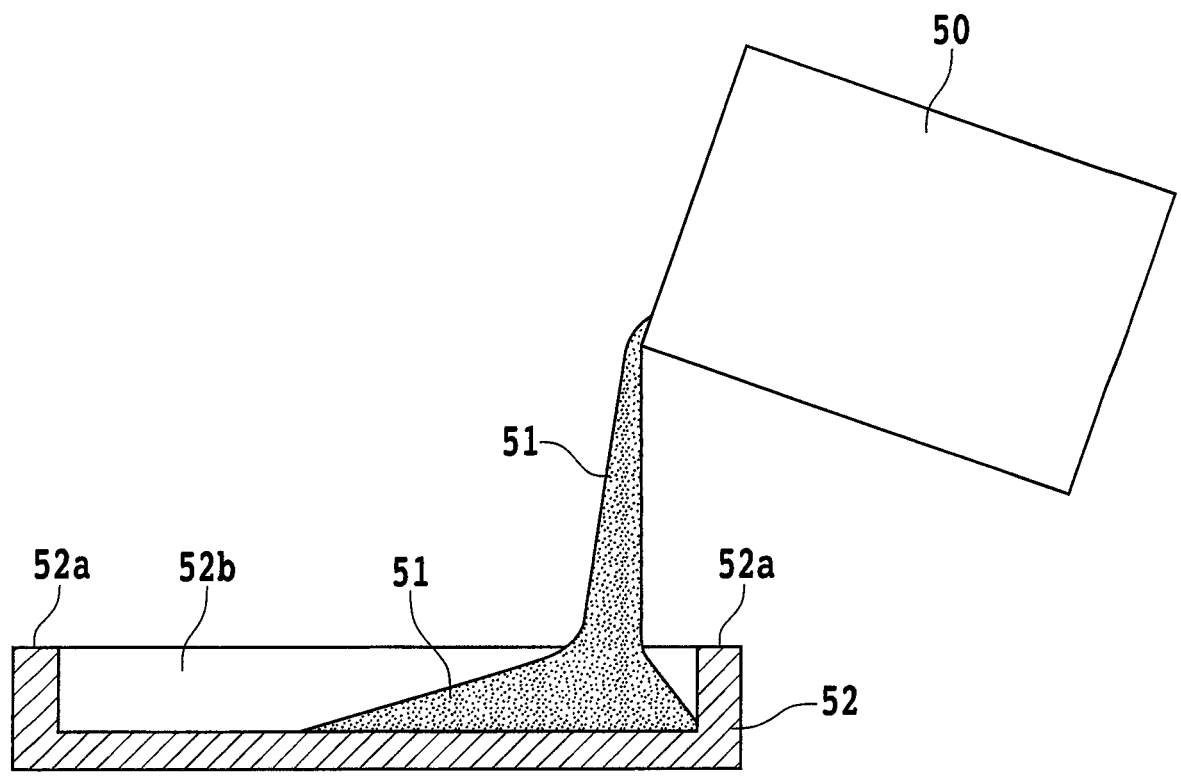
FIG. 2 is a view illustrating a supplying step (S10) of supplying glass particles to a mold frame.

A process of manufacturing the porous chuck table 30 will hereinafter be described below with reference to FIGS. 2 through 9. FIG. 2 is a view illustrating a supplying step (S10) of supplying glass particles 51 to a mold frame 52. The mold frame 52 is in the form of a cylindrical receptacle made of metal or ceramics capable of withstanding sintering at a high temperature of 1300° C. or higher. The mold frame 52 has a disk-shaped cavity 52b defined therein that is shaped correspondingly to the porous plate 32. The cavity 52b has a predetermined depth from a face side 52a of the mold frame 52. The mold frame 52 includes an annular wall on an outer circumferential end of the cavity 52b in the mold frame 52. The annular wall has an upper end serving as the face side 52a of the mold frame 52. According to the present embodiment, the glass particles 51, whose particle diameters are selected in the predetermined range referred to above, are supplied from a glass particle supply source 50 into the cavity 52b in the mold frame 52. According to the present embodiment, the glass particle supply source 50 supplies more glass particles than those glass particles 51 that can be accommodated in the cavity 52b in the mold frame 52, into the cavity 52b in the mold frame 52.

Figure 3:
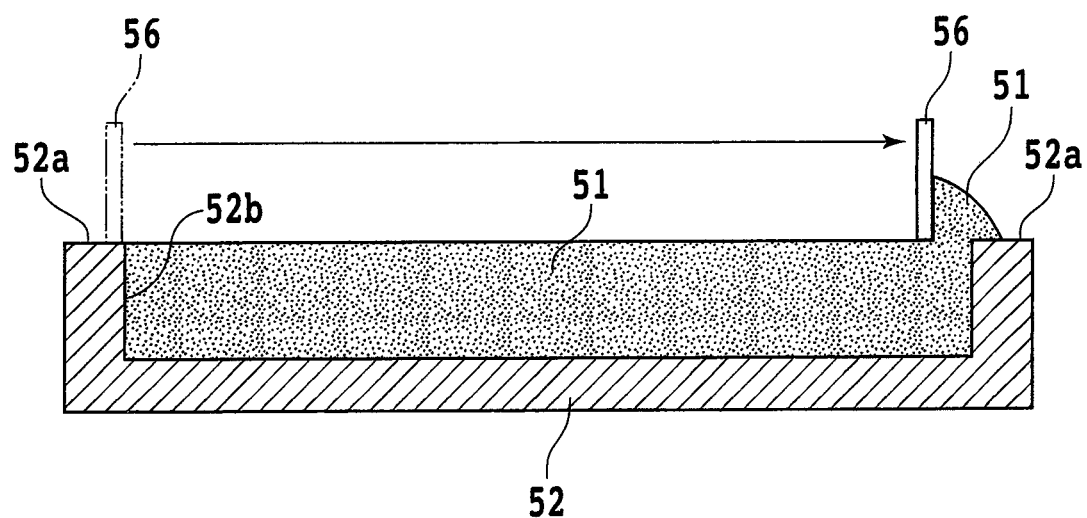
FIG. 3 is a view illustrating a removing step (S20) of removing glass particles that have overflowed from the mold frame.

In other words, the glass particle supply source 50 supplies the cavity 52b in the mold frame 52 with an overflowing number of glass particles 51 such that some of the supplied glass particles 51 will overflow and spill over the face side 52a of the mold frame 52. Then, the glass particles 51 that have overflowed and spilled over the face side 52a of the mold frame 52 are removed by a squeegee 56 (see FIG. 3). According to the present embodiment, the squeegee 56 is in the form of a flat plate of plastics. However, the squeegee 56 may be made of rubber or metal. According to the present embodiment, one side, i.e., a lower edge, of the squeegee 56 is kept in contact with the face side 52a of the mold frame 52, and then the squeegee 56 is moved diametrically from one end to the other of the face side 52a of the mold frame 52. Those glass particles 51 that are positioned above the face side 52a of the mold frame 52 are now removed from the mold frame 52 by the squeegee 56. The group of glass particles 51 that remains in the cavity 52b in the mold frame 52 includes those glass particles 51 which are evenly positioned at substantially the same height as the face side 52a of the mold frame 52. FIG. 3 is a view illustrating a removing step (S20) of removing the glass particles 51 that have overflowed from the mold frame 52. According to the present embodiment, the supplying step (S10) and the removing step (S20) are collectively referred to as a filling step of filling the mold frame 52 with glass particles 51.

Figure 4:
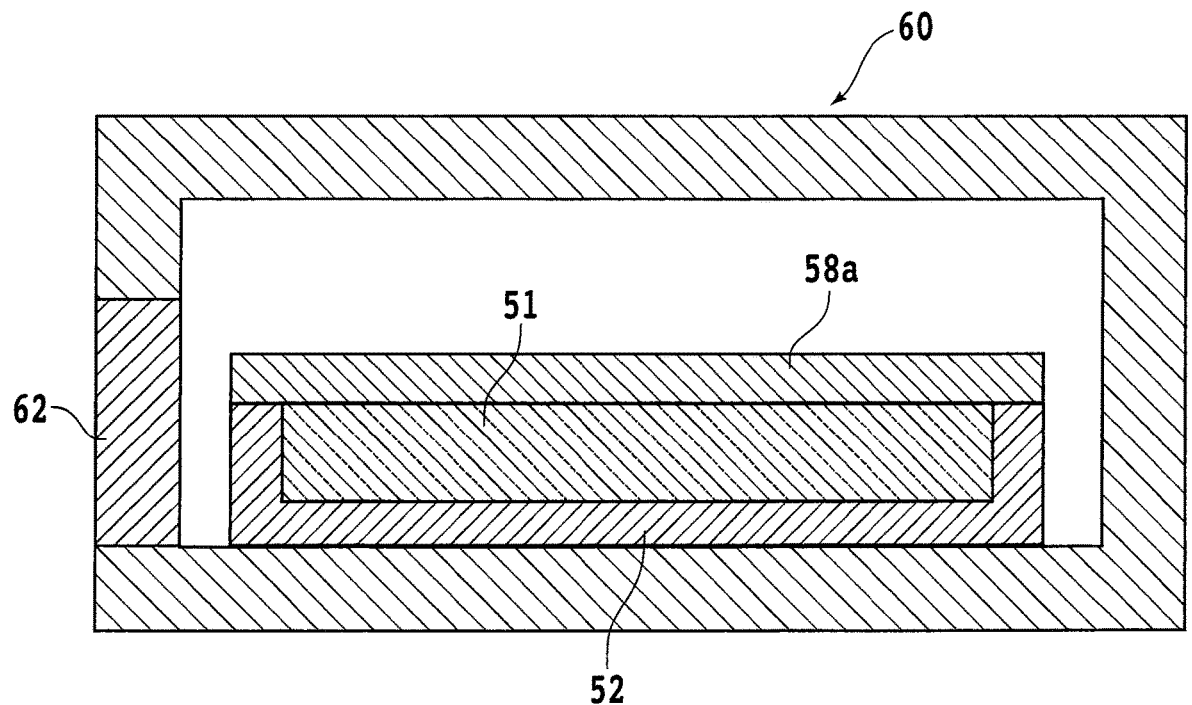
FIG. 4 is a view illustrating a sintering step (S30) of sintering the glass particles.

Then, a disk-shaped lid plate 58a (see FIG. 4) that is made of metal or ceramics as with the mold frame 52 is fixed to the face side 52a of the mold frame 52, confining the glass particles 51 that have filled the cavity 52b in the mold frame 52. Then, the glass particles 51 enclosed by the mold frame 52 and the lid plate 58a are put into a sintering furnace 60 through an openable and closable door 62, and are thereafter sintered. FIG. 4 is a view illustrating a sintering step (S30) of sintering the glass particles 51. The glass particles 51 may be sintered at a sintering temperature in a range from 600° C. to 1300° C., for example. According to the present embodiment, the sintering temperature ranges from 700° C. to 800° C. in excess of the softening point of the glass particles 51. Generally, a sintering temperature at which ceramics particles are sintered is in a range from 1100° C. to 1300° C. According to the present embodiment, the group of glass particles 51 in the cavity 52b is sintered at the temperature ranging from 700° C. to 800° C. for a predetermined time ranging from approximately 30 minutes to approximately three hours. In this manner, the group of glass particles 51 in the cavity 52b is sintered into a porous plate 32 in which adjacent ones of the spherical glass particles 51 are partly joined together with interstices left therebetween.

Figure 5:
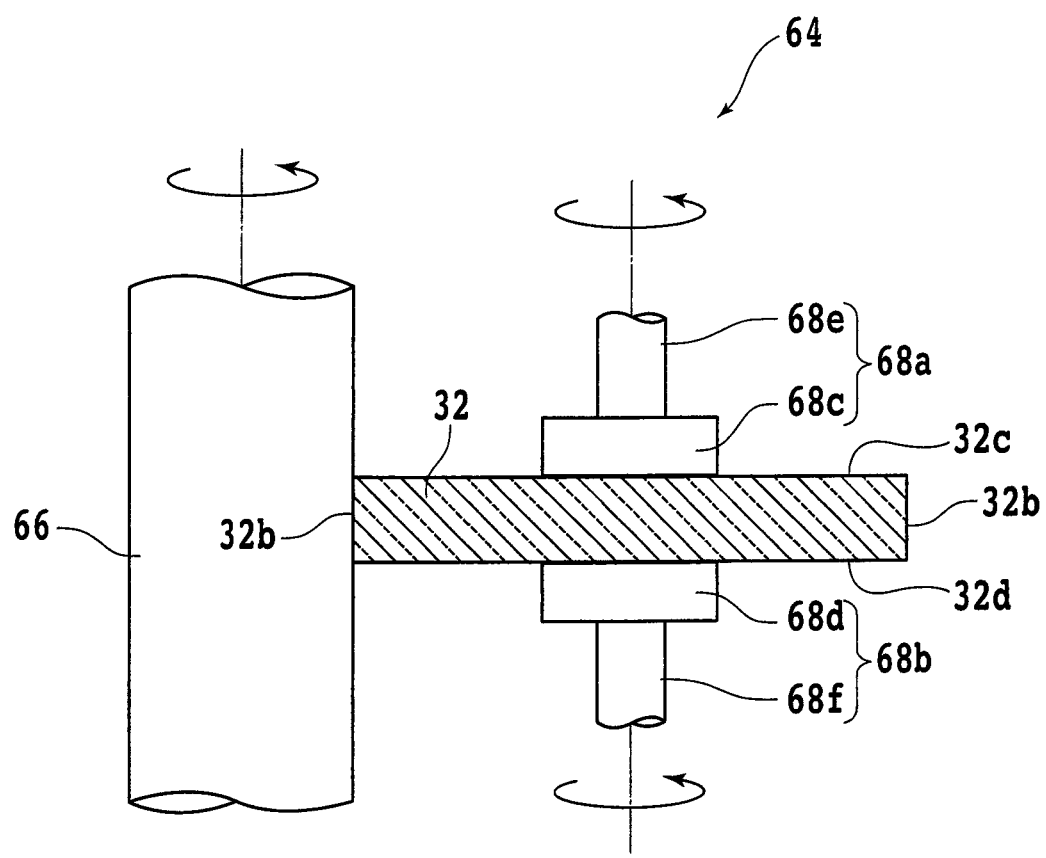
FIG. 5 is a view illustrating a step (S40) of polishing an outer circumferential side surface of a porous plate with a cylindrical polishing apparatus.

The longer the time in which the group of glass particles 51 is sintered, the longer the time in which the glass of the glass particles 51 is melted and remains flowable, with the results that the area of contact between adjacent ones of the glass particles 51 increases, lowering the porosity of the porous plate 32. For example, the porosity of a porous plate 32 produced by sintering glass particles 51 for three hours is lower than the porosity of a porous plate 32 produced by sintering glass particles 51 for 30 minutes. Then, the sintered porous plate 32 is ground to correct the shape thereof to match the shape of the recess 34b in the frame 34. FIG. 5 is a view illustrating a step (S40) of polishing an outer circumferential side surface 32b of the porous plate 32 with a cylindrical polishing apparatus 64. The cylindrical polishing apparatus 64 has a cylindrical grinding stone 66. The cylindrical grinding stone 66 includes a grinding stone on its side surface which is made of a mixture of a bonding material, i.e., a binder, of metal, ceramics, resin, or the like and abrasive grains of diamond, cubic boron nitride (cBN) or the like. The cylindrical grinding stone 66 has an axial end connected to a rotary actuator such as an electric motor, and is rotatable about its own central axis by the rotary actuator.

The cylindrical polishing apparatus 64 also includes a pair of rotary grips 68a and 68b disposed adjacent to the cylindrical grinding stone 66. The rotary grips 68a and 68b have respective central axes aligned with each other. The porous plate 32 to be polished is gripped between the rotary grips 68a and 68b. The rotary grip 68a has a presser 68c that is of a disk shape smaller in diameter than the porous plate 32, for contacting the face side 32c of the porous plate 32. The rotary grip 68a also includes a cylindrical rotor 68e connected coaxially to a surface of the presser 68c opposite to the surface thereof that contacts the porous plate 32. The cylindrical rotor 68e has its central axis extending parallel to the axis of rotation of the cylindrical grinding stone 66. Similarly, the rotary grip 68b has a presser 68d that is of a disk shape smaller in diameter than the porous plate 32, for contacting the reverse side 32d of the porous plate 32. The rotary grip 68b also includes a cylindrical rotor 68f connected coaxially to a surface of the presser 68d opposite to the surface thereof that contacts the porous plate 32. The cylindrical rotor 68f has its central axis extending parallel to the axis of rotation of the cylindrical grinding stone 66. When the pressers 68c and 68d are axially pushed toward each other until the porous plate 32 is gripped therebetween and the rotors 68e and 68e are rotated about their own axes, the porous plate 32 is rotated about its own axis. The grinding stone on the side surface of the rotating cylindrical grinding stone 66 is brought into contact with the outer circumferential side surface 32b of the porous plate 32, thereby polishing the outer circumferential side surface 32b of the porous plate 32.

Figure 6:
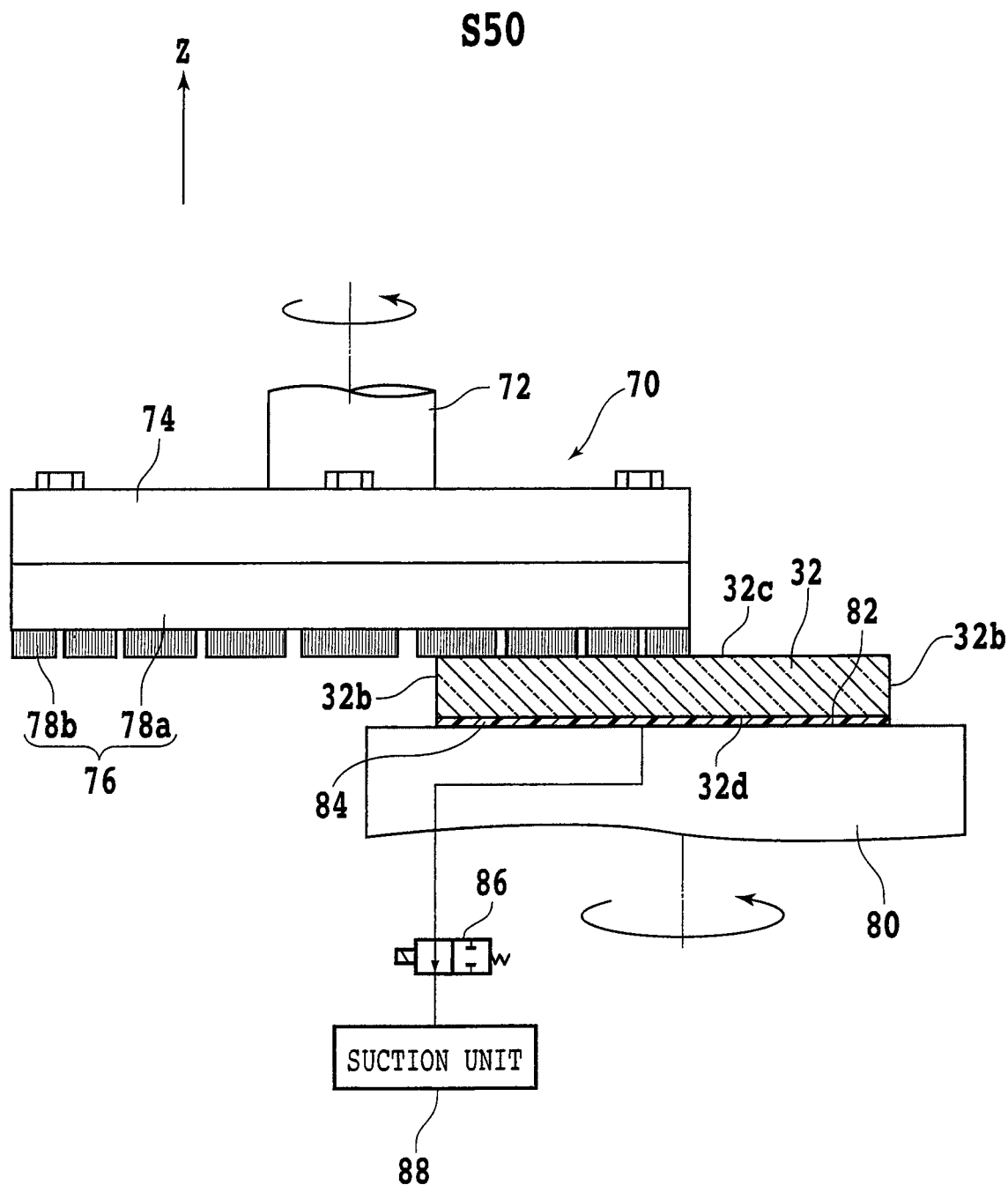
FIG. 6 is a view illustrating a step (S50) of grinding face and reverse sides of the porous plate with a grinding unit.

Then, the face and reverse sides 32c and 32d of the porous plate 32 are successively ground. FIG. 6 is a view illustrating a step (S50) of grinding the face and reverse sides 32c and 32d of the porous plate 32 with a grinding unit 70. For grinding the face side 32c of the porous plate 32, the porous plate 32 is placed on a porous chuck table 80 with a circular film 84, which is of substantially the same diameter as the porous plate 32, interposed therebetween. For example, the film 84 is stuck to the reverse side 32d of the porous plate 32, and the film 84 on the porous plate 32 is placed on the porous chuck table 80. The porous chuck table 80 is rotatable about its vertical central axis. The porous chuck table 80 has a holding surface 82 as its upper surface for contacting the film 84, and the holding surface 82 is smaller in diameter than the film 84. The porous chuck table 80 includes a porous plate having a porous structure extending from the holding surface 82 to a predetermined depth. The porous plate of the porous chuck table 80 may be made of ceramics particles or glass particles 51.

The porous chuck table 80 has a flow channel defined therein that is held in fluid communication with the holding surface 82 of the porous chuck table 80. The flow channel is connected through a valve 86 to a suction unit 88. When the valve 86 is open, the porous plate 32 is held under suction on the holding surface 82 of the porous chuck table 80 through the film 84 by a negative pressure generated by the suction unit 88. A grinding unit 70 is disposed above the porous chuck table 80. The grinding unit 70 includes a spindle 72 as a rotatable shaft extending generally parallel to Z-axis directions, i.e., vertical directions. The spindle 72 is vertically movable by a lifting and lowering mechanism, not illustrated. A disk-shaped wheel mount 74 is fixedly mounted on the lower end of the spindle 72. A grinding wheel 76, which is of substantially the same diameter as the wheel mount 74, is mounted on a lower surface of the wheel mount 74. The grinding wheel 76 includes an annular wheel base 78a made of a metal material such as aluminum and stainless steel.

The wheel base 78a has an upper surface fastened to the wheel mount 74 and hence is connected to the spindle 72. The grinding wheel 76 also includes a plurality of grinding stones 78b mounted on an annular lower surface of the wheel base 78a that is opposite to the upper surface thereof. Each of the grinding stones 78b is substantially in the shape of a rectangular parallelepiped. The grinding stones 78b are arranged in an annular array fully along the annular lower surface of the wheel base 78a with gaps left between adjacent ones of the grinding stones 78b. The grinding stones 78b are made of a bonding material, i.e., a binder, of metal, ceramics, resin, or the like and abrasive grains of diamond, cBN, or the like. However, the grinding stones 78b are not limited to any particular bonding materials and the abrasive grains, but may made of a bonding material and abrasive grains selected depending on the specifications of the grinding stones 78b. While the porous chuck table 80 and the spindle 72 are being rotated about their own axes in the same direction, the spindle 72 is lowered to press the grinding stones 78b against the face side 32c of the porous plate 32 to grind the face side 32c. The face side 32c of the porous plate 32 is now planarized.

Next, the porous chuck table 80 stops being rotated and is lifted, and the valve 86 is closed, after which the porous plate 32 is removed from the holding surface 82 of the porous chuck table 80. Then, the porous plate 32 is turned upside down, and the face side 32c of the porous plate 32 is placed on the holding surface 82 with the film 84 interposed therebetween. The valve 86 is then opened, holding the face side 32c of the porous plate 32 under suction on the holding surface 82. Thereafter, while the porous chuck table 80 and the spindle 72 are being rotated about their own axes in the same direction, the spindle 72 is lowered to press the grinding stones 78b against the reverse side 32d of the porous plate 32 to grind the reverse side 32d. The reverse side 32d of the porous plate 32 is now planarized. According to the present embodiment, the step (S40) of polishing the outer circumferential side surface 32b of the porous plate 32 with a cylindrical polishing apparatus 64 and the step (S50) of grinding the face and reverse sides 32c and 32d of the porous plate 32 with the grinding unit 70 are collectively referred to as a correcting step of correcting the porous plate 32. Since the outer circumferential side surface 32b of the porous plate 32 is essentially ground in the step (S40), the step (S40) may be referred to as a step (S40) of grinding the outer circumferential side surface 32b of the porous plate 32.

The grinding unit 70 according to the present embodiment is a so-called rotary grinder. According to a modification, a grinding unit 70 includes a cylindrical grinding stone having a height of approximately 100 mm. In operation, the side surface of the cylindrical grinding stone that rotates about its own central axis is pressed against the face 32c of the porous plate 32 on the porous chuck table 80. At this time, the porous chuck table 80, on which the reverse side 32d of the porous plate 32 is attracted to the holding surface 82 with the film 84 interposed therebetween, is rotated about its own axis. Then, the cylindrical grinding stone and the porous chuck table 80 are moved relatively to each other along the directions, i.e., processing-feed directions, of the central axis of the cylindrical grinding stone, thereby grinding the face side 32c of the porous plate 32. After the face side 32c of the porous plate 32 has been ground, the porous plate 32 is turned upside down, and the reverse side 32d of the porous plate 32 is ground.

Figure 7A:
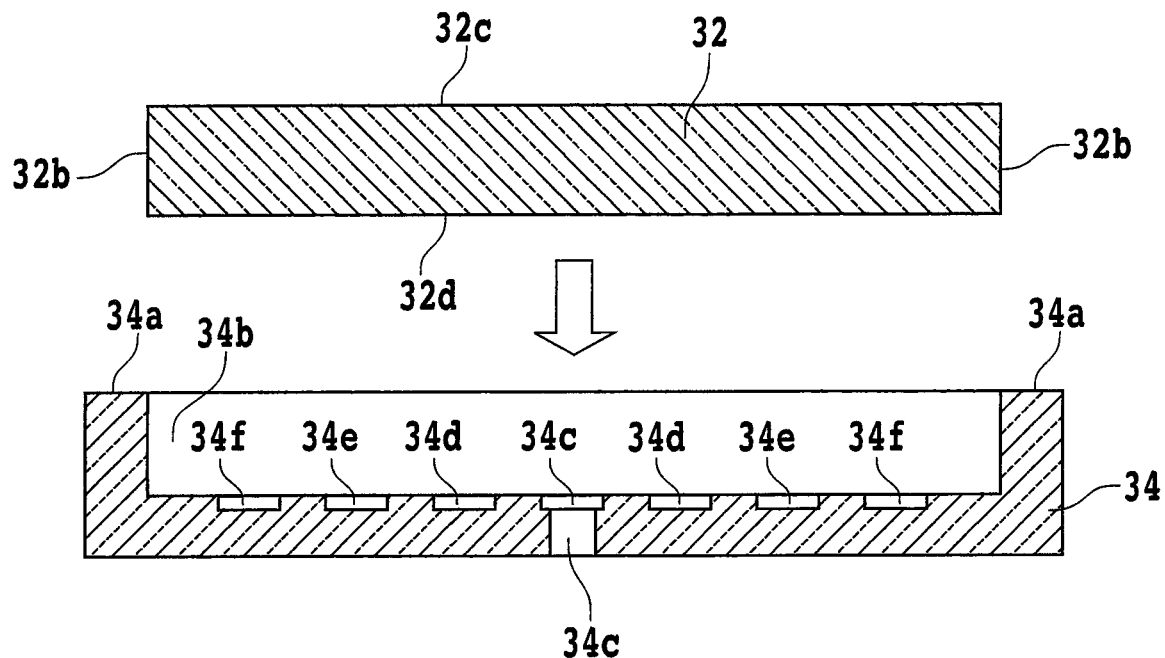
FIG. 7A is a view illustrating a fixing step (S60) of fixing the porous plate to a frame.
Figure 7B:
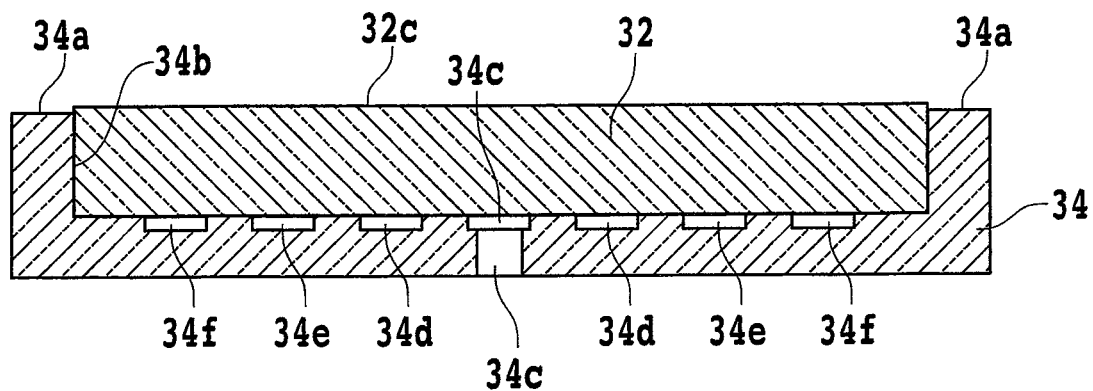
FIG. 7B is a view illustrating the porous plate fixedly placed in a recess in the frame.
Figure 8:
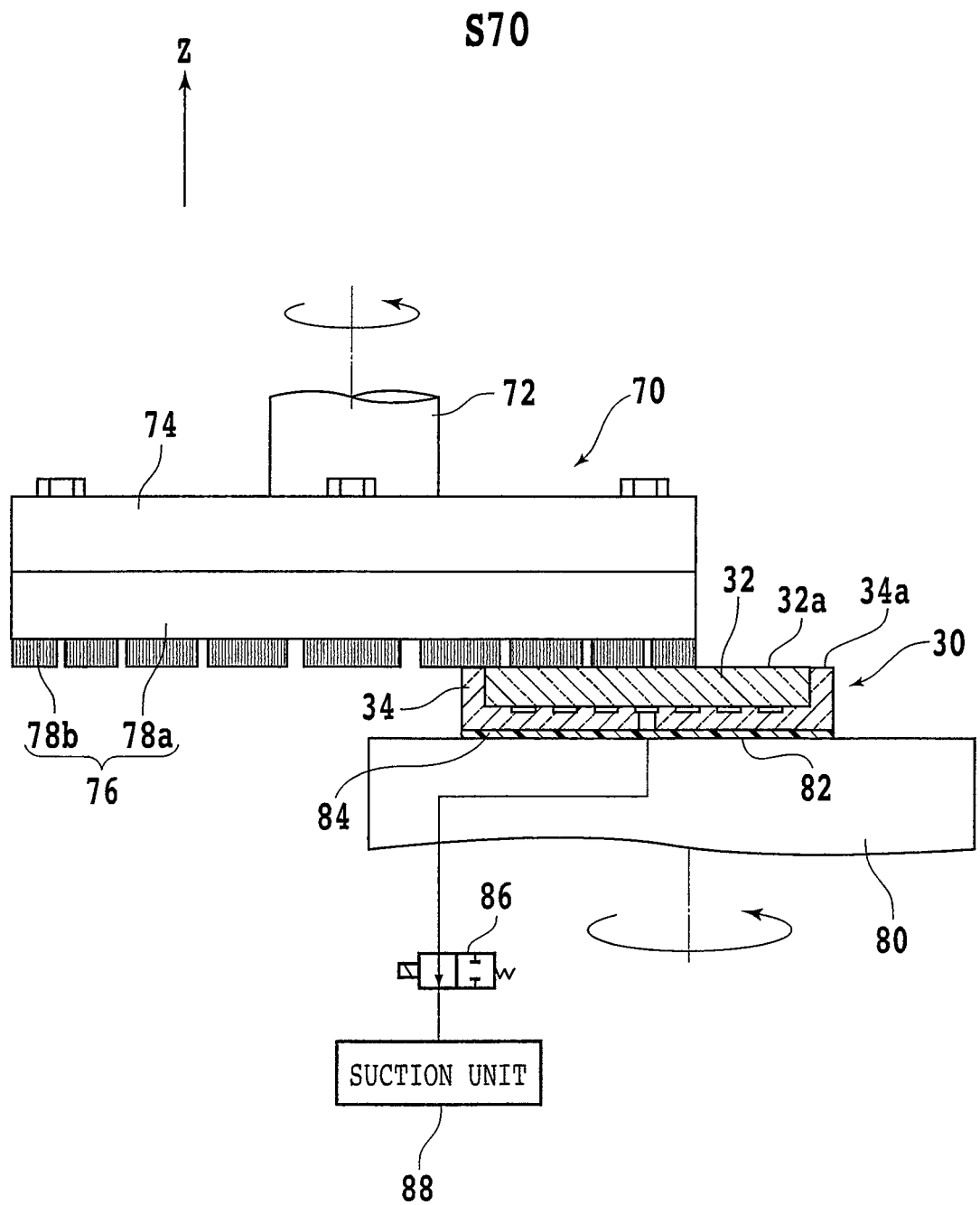
FIG. 8 is a view illustrating a grinding step (S70) grinding the face side of the porous plate and a face side of the frame.

After the correcting step (S40, S50), the porous plate 32 is fixedly placed in the recess 34b in the frame 34 by an adhesive. FIG. 7A is a view illustrating a fixing step (S60) of fixing the porous plate 32 to the frame 34, and FIG. 7B is a view illustrating the porous plate 32 fixedly placed in the recess 34b in the frame 34. The adhesive is applied to localized areas in the recess 34b in the frame 34 so as not to close the flow channels 34c, 34d, 34e and 34f in the frame 34. Then, with the porous plate 32 fixed to the frame 34, the grinding unit 70 (see FIG. 8) grinds both the face side 32c of the porous plate 32 and the face side 34a of the frame 34 to planarize them. FIG. 8 is a view illustrating a grinding step (S70) of grinding the face side 32c of the porous plate 32 and the face side 34a of the frame 34. According to the present embodiment, a film 84 that is of substantially the same diameter as the bottom of the frame 34 is interposed between the frame 34 and the porous chuck table 80. Then, the frame 34 is held under suction on the holding surface 82 of the porous chuck table 80 through the film 84 by a negative pressure generated by the suction unit 88. Thereafter, while the porous chuck table 80 and the spindle 72 are being rotated about their own axes in the same direction, the spindle 72 is lowered to press the grinding stones 78b against the porous plate 32 and the frame 34 that are integrally combined with each other.

Figure 9:
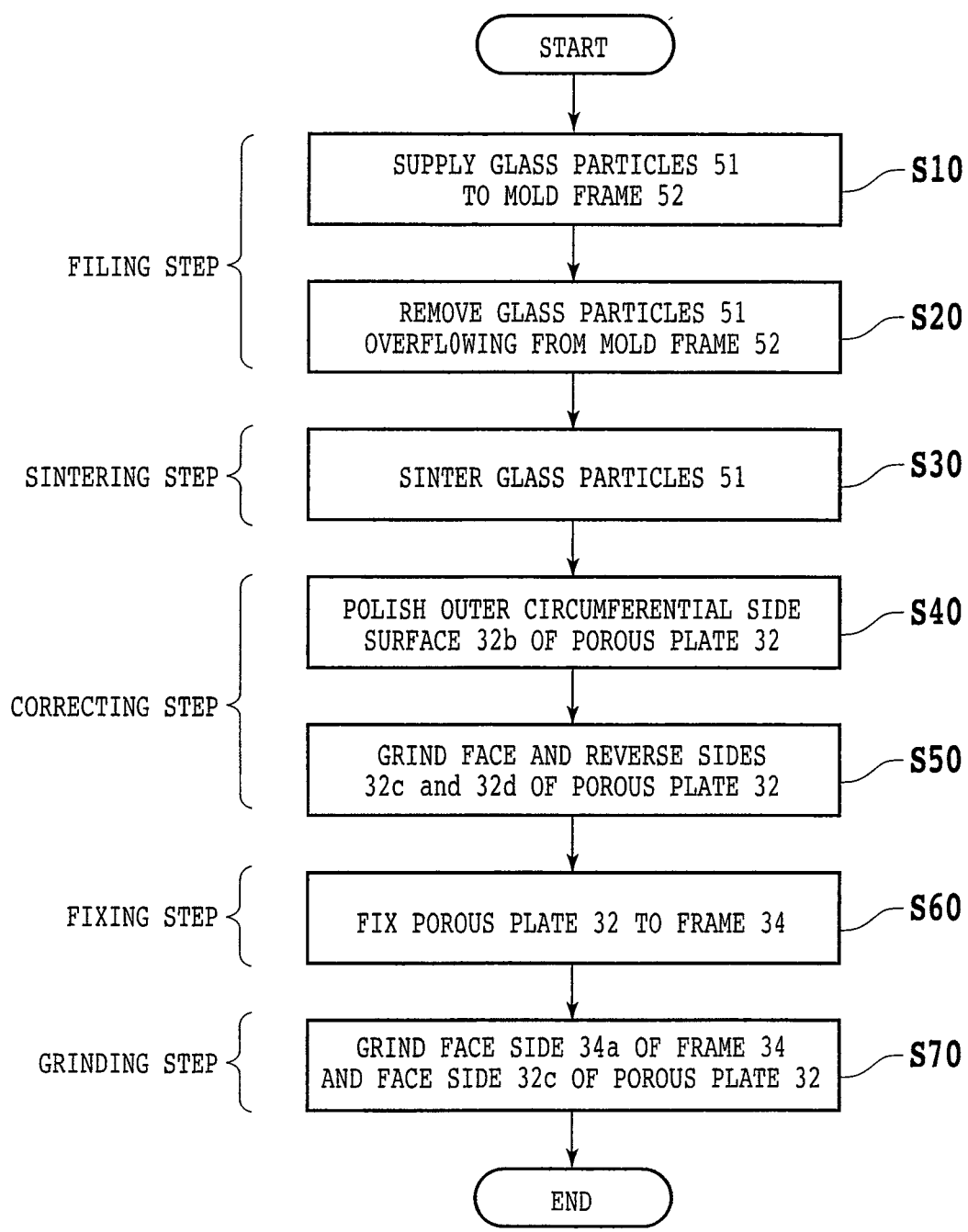
FIG. 9 is a flowchart of the steps for manufacturing a porous chuck table.
Figure 10A:
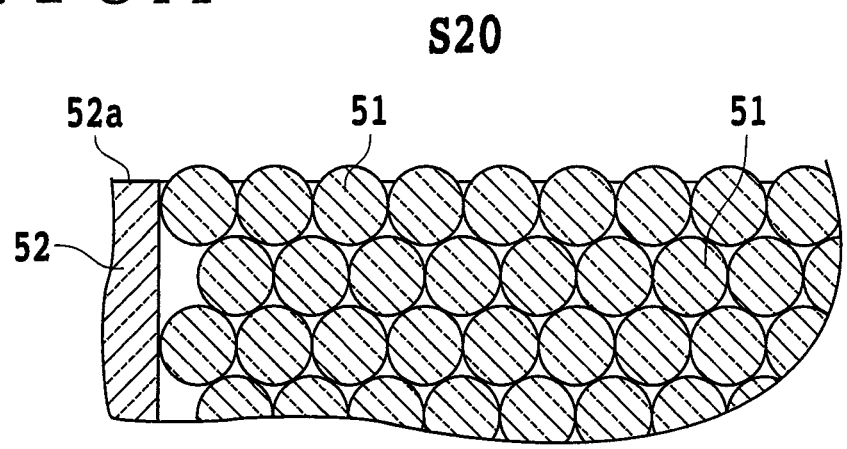
FIG. 10A is a fragmentary schematic cross-sectional view of the mold frame and glass particles after the removing step (S20) and before the sintering step (S30)

The face side 32c of the porous plate 32 and the face side 34a of the frame 34 are now ground so as to lie flush with each other. According to the present embodiment, the face side 32c of the porous plate 32 on the porous chuck table 30 is referred to as the holding surface 32a. The steps illustrated respectively in FIGS. 2 through 8 are illustrated in FIG. 9. FIG. 9 is a flowchart of the steps for manufacturing the porous chuck table 30. The processing of the glass particles 51 in the removing step (S20) of removing the glass particles 51, the sintering step (S30) of sintering the glass particles 51, and the grinding step (S70) will be described below. Since the glass particles 51 are substantially uniform in size, the glass particles 51 can be placed into the mold frame 52 to fill the mold frame 52 regularly compared to ceramics particles that are irregular in shape. FIG. 10A is a fragmentary schematic cross-sectional view of the mold frame 52 and the glass particles 51 after the removing step (S20) and before the sintering step (S30).

Figure 10B:
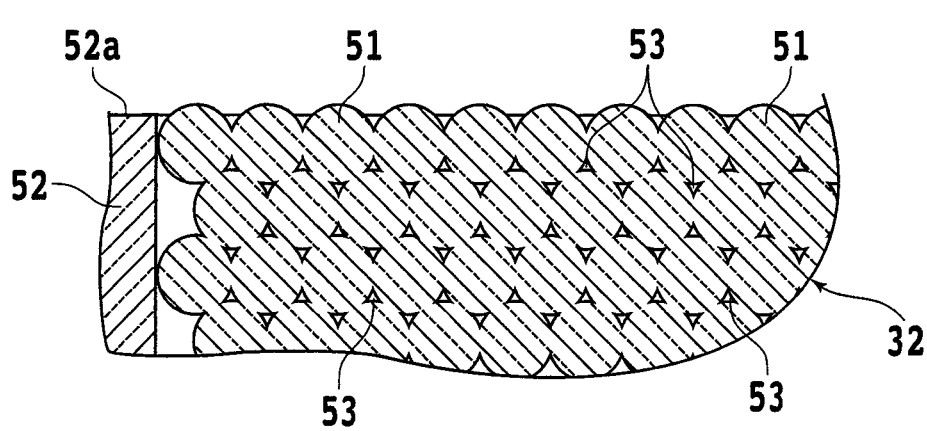
FIG. 10B is a fragmentary schematic cross-sectional view of the mold frame and the glass particles after the sintering step (S30) and before the grinding step (S70)

In FIG. 10A, some of the glass particles 51 remaining in the mold frame 52 are schematically illustrated as round. Actually, more glass particles 51 than those illustrated as round are present in the mold frame 52. In FIG. 10A, furthermore, an uppermost layer of glass particles 51 is illustrated as protruding from the face side 52a of the mold frame 52. However, the uppermost layer of glass particles 51 may be positioned below the face side 52a of the mold frame 52. FIG. 10B is a fragmentary schematic cross-sectional view of the mold frame 52 and the glass particles 51 after the sintering step (S30) and before the grinding step (S70). In the sintering step (S30), as described above, the glass particles 51 are sintered at the temperature ranging from 700° C. to 800° C. for the predetermined time ranging from approximately 30 minutes to approximately three hours. The sintering of the glass particles 51 is finished while interstices are being left between the glass particles 51 in the porous plate 32. In other words, each of the glass particles 51 is not fully melted in the sintering step (S30) according to the present embodiment.

FIG. 100 is a fragmentary schematic cross-sectional view of the frame 34 and the glass particles 51 after the grinding step (S70). The face side 34a of the frame 34 and the face side 32c of the porous plate 32 that have been secured to each other and integrally combined with each other are ground so as to lie flush with each other. Those glass particles 51 that are located in positions exposed from the frame 34 are partly removed and have flat upper ends. The flat upper ends of those glass particles 51 and pores 53 therebetween make up the holding surface 32a of the porous plate 32. As described above, the holding surface 32a of the porous plate 32 is flat and has a center-line average roughness Ra of 5.0 μm or less or a maximum height Ry of 25 μm or less. The pores 53 that are present between the glass particles 51 are spatially interconnected, providing a flow channel for a gas that extends from the reverse side 32d of the porous plate 32 to the holding surface 32a thereof. The flow channel has an end exposed on the holding surface 32a. The exposed end of the flow channel is not localized on the holding surface 32a, but is present substantially evenly over the holding surface 32a in its entirety.

Since the porous plate 32 according to the present invention is made of glass particles 51 that are highly uniform in diameter and are nearly spherical compared to ceramics particles, the pores 53 provided by the interstices between the glass particles 51 are more uniform in size than the pores in a porous plate made of ceramics particles that are irregular in shape. Inasmuch as the highly uniform pores 53 are thus exposed on the holding surface 32a of the porous plate 32 of the porous chuck table 30 according to the present invention, the suction force developed in the holding surface 32a is rendered more uniform than the suction force developed in the holding surface of the porous plate made of ceramics particles.

Figure 10C:
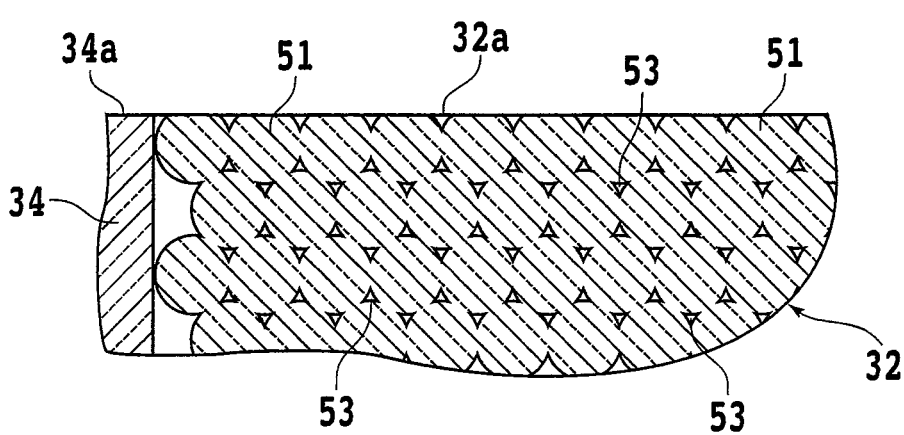
FIG. 10C is a fragmentary schematic cross-sectional view of the frame and the glass particles after the grinding step (S70)

The uniformity of the suction force in the holding surface 32a is important especially when the workpiece 11 is diced into small rectangular chips. For example, if the suction force in the holding surface 32a is not uniform, then since the produced small chips are not stably attracted to the holding surface 32a, the small chips tend to be displaced out of position. As a result, the chips are liable to develop corner cracks and chippings on their reverse sides. However, the suction force developed in the holding surface 32a of the porous plate 32 according to the present embodiment is highly uniform compared to the suction force developed in the holding surface of the porous plate made of ceramics particles. Therefore, the porous plate 32 according to the present embodiment can hold produced small chips at desired positions on the holding surface 32a thereof. Thus, the holding surface 32a is suitable for dicing the workpiece 11 into small chips. Although not illustrated in FIG. 10C, the outer circumferential side surface 32b of the porous plate 32 is ground as described above. Consequently, the outer circumferential side surface 32b of the porous plate 32 is flat as viewed across a sectional plane passing through the center of the holding surface 32a of the porous plate 32.

Figure 11:
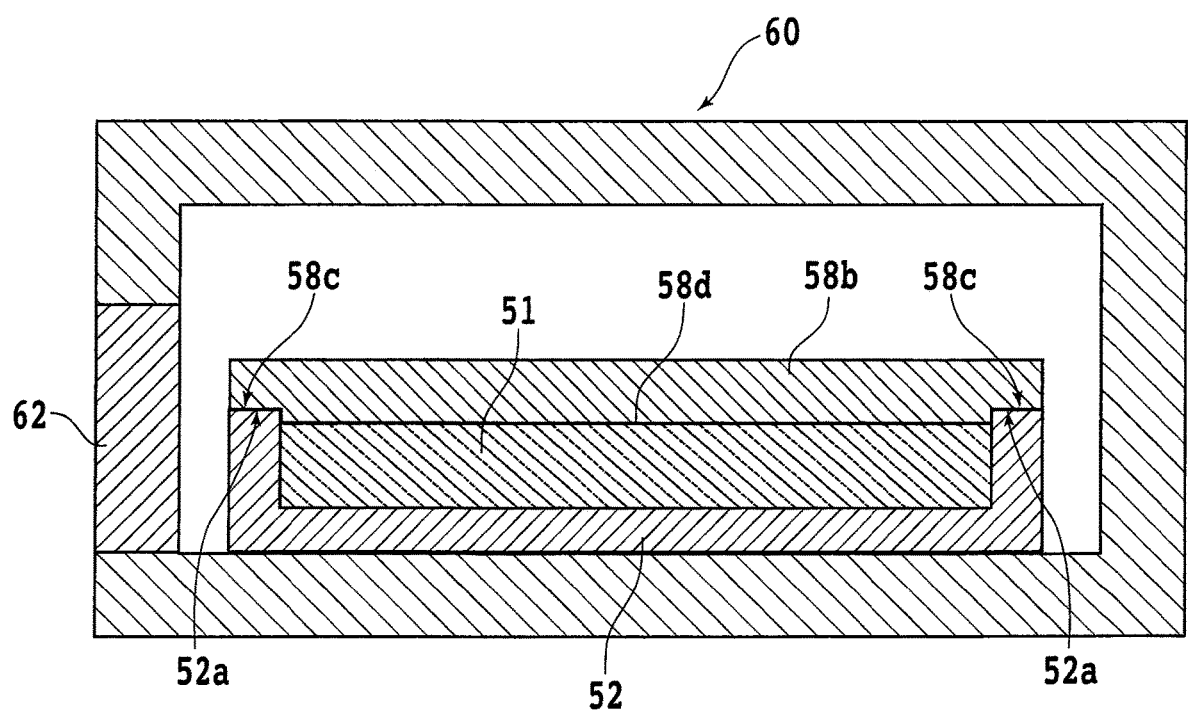
FIG. 11 is a view illustrating a first modification (S35) of the sintering step of sintering the glass particles.

Next, a first modification of the sintering step (S30) according to the first embodiment will be described below. FIG. 11 is a view illustrating a first modification (S35) of the sintering step of sintering the glass particles 51. In the sintering step (S35) according to the first modification, a lid plate 58b having a step between an edge portion 58c and a central portion 58d on its bottom surface is used instead of the lid plate 58a having a flat bottom surface. Specifically, the bottom surface of the lid plate 58b includes the edge portion 58c and the central portion 58d surrounded by the edge portion 58c and protruding downwardly from the edge portion 58c. When the lid plate 58b is pressed into the mold frame 52 to bring the face side 52a of the mold frame 52 into contact with the edge portion 58c of the lid plate 58b, the glass particles 51 in the cavity 52b in the mold frame 52 are pressurized by the central portion 58d of the lid plate 58b and the mold frame 52. When the glass particles 51 pressurized by the lid plate 58b and the mold frame 52 are sintered, the pressure applied to the glass particles 51 in the sintering step (S35) is higher than the pressure applied to the glass particles 51 in the sintering step (S30).

For example, when the glass particles 51 are pressurized using the lid plate 58b, the melted glass particles 51 are likely to fill the interstices. Therefore, the porosity of the porous plate 32 can be made lower than if the glass particles 51 are not pressurized. Instead of the pressurization or in addition to the pressurization, the sintering time or the sintering temperature may be altered. As the sintering time is longer, the glass particles 51 remain melted for a longer time, making it easier for the interstices in the porous plate 32 to be filled, with the result that the porosity of the porous plate 32 becomes lower. As the sintering temperature is higher, it is easier for the glass particles 51 to be melted, making it easier for the interstices in the porous plate 32 to be filled, with the result that the porosity of the porous plate 32 becomes lower. In the sintering step (S35), at least one of the pressure, the sintering temperature, and the sintering time is altered from the corresponding one in the sintering step (S30), thereby adjusting the porosity of the porous plate 32.

Next, a second modification in which a porous plate 32 is produced using frit 55 (see FIG. 12A) in addition to glass particles 51 will be described below. The frit 55 that is used in the second modification refers to a powder of glass particles that are made of the same glass material as the glass particles 51 and smaller in diameter than the glass particles 51. Though the frit 55 may be made of a glass material different from the glass material of the glass particles 51, it is desirable that the frit 55 have a melting point lower than the glass particles 51. According to the second modification, frit 55 and glass particles 51 are mixed with each other and supplied to the mold frame 52 in a supplying step (S15) rather than the supplying step (S10), i.e., the former half of the filling step. In a removing step (S25) according to the second modification, instead of the removing step (S20), i.e., the latter half of the filling step, glass particles 51 and frit 55 that have overflowed and spilled over the face side 52a of the mold frame 52 are removed by the squeegee 56. In this manner, the mold frame 52 is filled with frit 55 and glass particles 51.

Figure 12A:
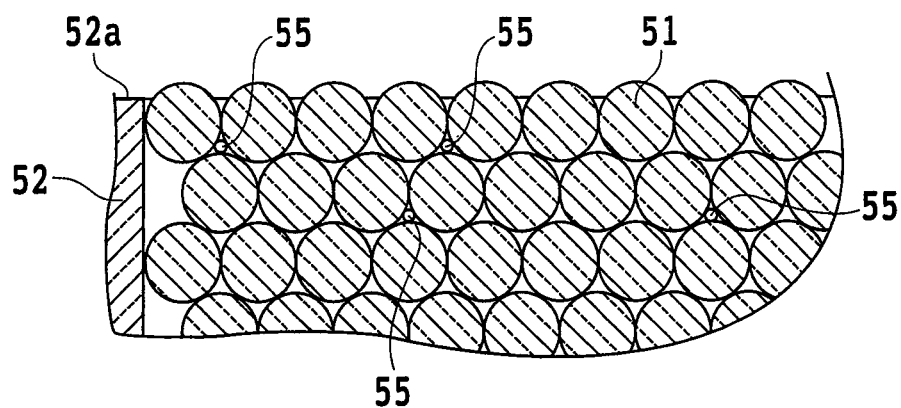
FIG. 12A is a fragmentary schematic cross-sectional view of the mold frame and the glass particles after a removing step (S25) and before a sintering step (S35) according to a second modification.
Figure 12B:
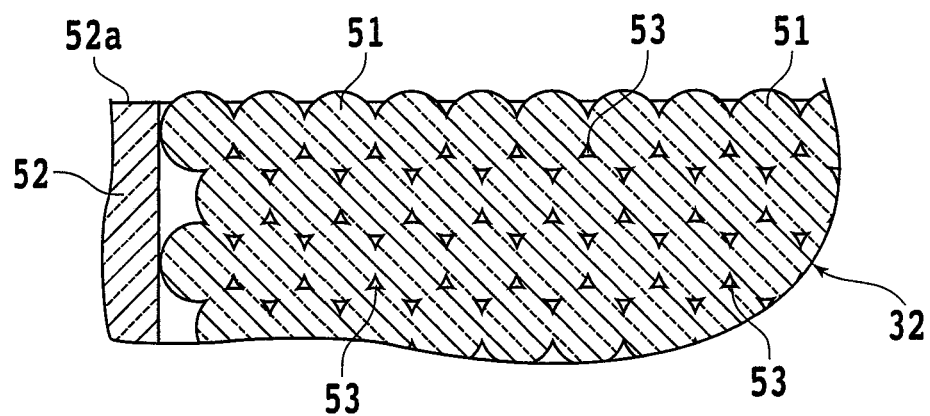
FIG. 12B is a fragmentary schematic cross-sectional view of the mold frame and the glass particles after the sintering step (S35) and before a grinding step (S70) according to the second modification.

FIG. 12A is a fragmentary schematic cross-sectional view of the mold frame 52 and the glass particles 51 after the removing step (S25) according to the second modification and before the sintering step (S35). In FIG. 12A, the frit 55 has entered some of the interstices between the glass particles 51. After the removing step (S25), the glass particles 51 and the frit 55 are sintered in the sintering step (S35). FIG. 12B is a fragmentary schematic cross-sectional view of the mold frame 52 and the glass particles 51 after the sintering step (S35) and before a grinding step (S70) according to the second modification. The frit 55 melted in the sintering step (S35) fills at least some of the interstices. The frit 55 mixed with the glass particles 51 is effective to increase the bonding strength between the glass particles 51 compared to the first embodiment.

Figure 12C:
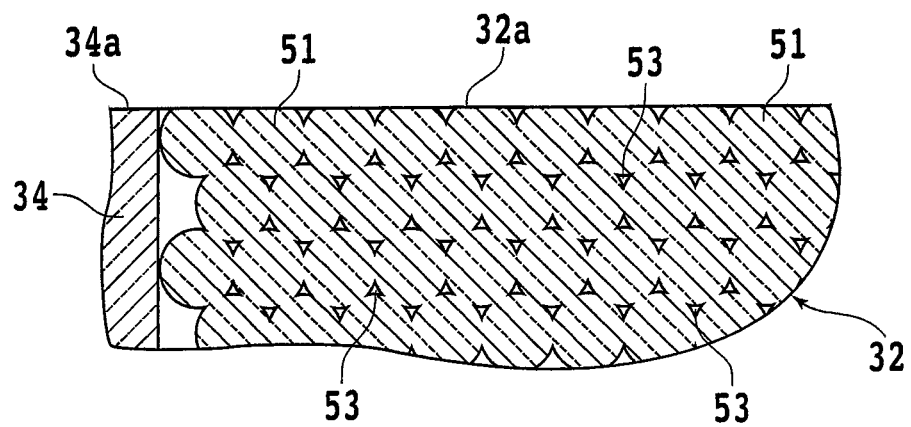
FIG. 12C is a fragmentary schematic cross-sectional view of the mold frame and the glass particles after the sintering step (S70) according to the second modification.

Using the frit 55, it is also possible to reduce the porosity of the porous plate 32. For example, using the frit 55, the porosity of the porous plate 32 can be adjusted to a given value ranging from 5% to 20% without varying the sintering temperature, the sintering time, or the pressure from the corresponding one in the first embodiment. After the sintering step (S35), as with the first embodiment, the step (S40) of polishing the outer circumferential side surface 32b of the porous plate 32, the step (S50) of grinding the face and reverse sides 32c and 32d of the porous plate 32, and the fixing step (S60) are carried out, and then the grinding step (S70) is carried out. FIG. 12C is a fragmentary schematic cross-sectional view of the mold frame 34 and the glass particles 51 after the sintering step (S70) according to the second modification.

Figure 13:
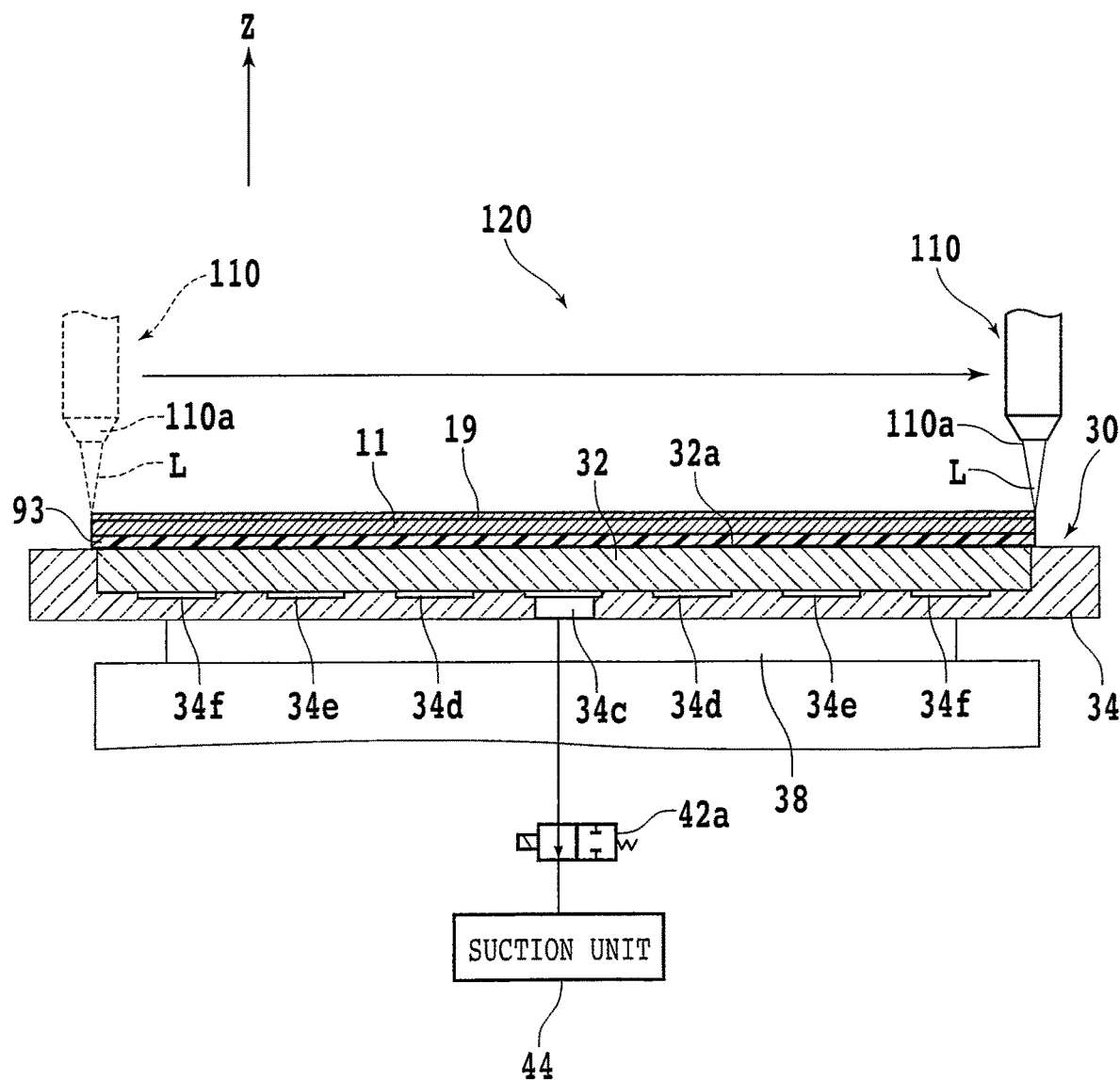
FIG. 13 is a side elevational view, partly in cross section, of a processing apparatus according to a second embodiment of the present invention.

Next, a processing apparatus 120 (see FIG. 13) having the porous chuck table 30 described above and a laser beam applying unit 110 according to a second embodiment will be described below. FIG. 13 is a side elevational view, partly in cross section, of the processing apparatus 120 according to the second embodiment. For processing the workpiece 11 by applying a laser beam L to the workpiece 11, the workpiece 11 is attracted to and held on the holding surface 32a of the porous plate 32 with a protective tape 93 interposed therebetween. The porous plate 32 and the frame 34 make up the porous chuck table 30 as with the first embodiment, and the porous chuck table 30 is fixedly mounted on the table base 38. As with the first embodiment, furthermore, the flow channel 34c in the porous chuck table 30 is held in fluid communication with the suction unit 44 through the valve 42a. The porous chuck table 30 holds the workpiece 11 under suction on the holding surface 32a through the protective tape 93 by a negative pressure generated by the suction unit 44.

The laser beam applying unit 110 for processing the workpiece 11 is disposed above the porous chuck table 30. The laser beam applying unit 110 has a laser head 110a that applies a laser beam L, which has a predetermined wavelength that is transmittable through the workpiece 11, to the workpiece 11. Providing the workpiece 11 is a silicon wafer, the predetermined wavelength of the laser beam L is approximately 1060 nm or 1300 nm. When the laser beam L is applied to the workpiece 11 while a focal point P (see FIG. 14) of the laser beam L is being positioned at a predetermined depth in the workpiece 11, multiphoton absorption occurs at the focal point P, thereby modifying the workpiece 11. As a result, the mechanical strength of the workpiece 11 in the vicinity of the focal point P is lowered. The laser beam L and the workpiece 11 are relatively moved along a projected dicing line on the workpiece 11, a modified layer 19 is formed in the workpiece 11. In the workpiece 11, cracks directed toward the face side of the workpiece 11 extend from the modified layer 19.

Figure 14:
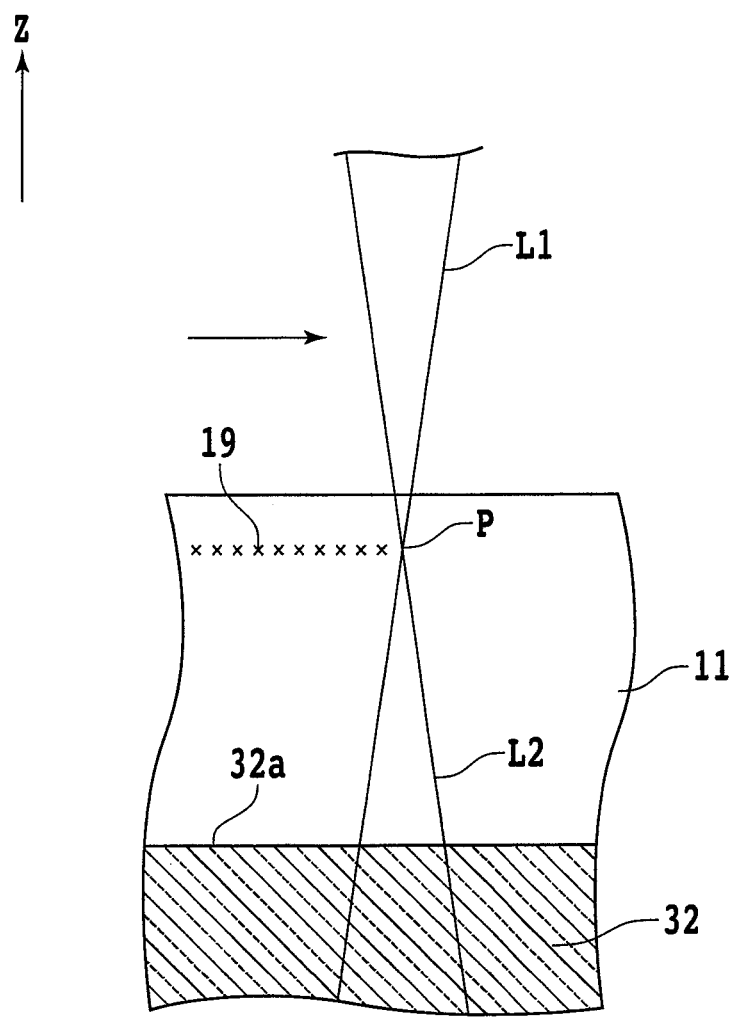
FIG. 14 is an enlarged fragmentary view of a region in the vicinity of a focal point P of a laser beam L.

The modified layer 19 and its vicinity is illustrated at an enlarge scale in FIG. 14. FIG. 14 is an enlarged fragmentary view of a region in the vicinity of the focal point P of the laser beam L. In FIG. 14, an area where the modified layer 19 is formed is indicated by a symbol x. According to the present embodiment, the laser beam L below the focal point P is referred to as a transmitted laser beam L2. The transmitted laser beam L2 that travels downwardly in the porous plate 32 from the focal point P is not essentially absorbed by the porous plate 32 and travels further downwardly in the porous plate 32. As the porous plate 32 according to the present embodiment is made of glass particles 51, it does not absorb the transmitted laser beam L2 in the porous plate 32. Even if the porous plate 32 absorbs the transmitted laser beam L2, the absorption is so small that the composition and structure of the porous plate 32 remains unchanged. Therefore, in a case where the porous plate 32 according to the present embodiment is used in the porous chuck table 30 of the processing apparatus 120, the porous plate 32 will not be broken or damaged by the laser beam L. In a case where the frame 34 is made of glass, the frame 34 will not be broken or damaged by the laser beam L.

Figure 15:
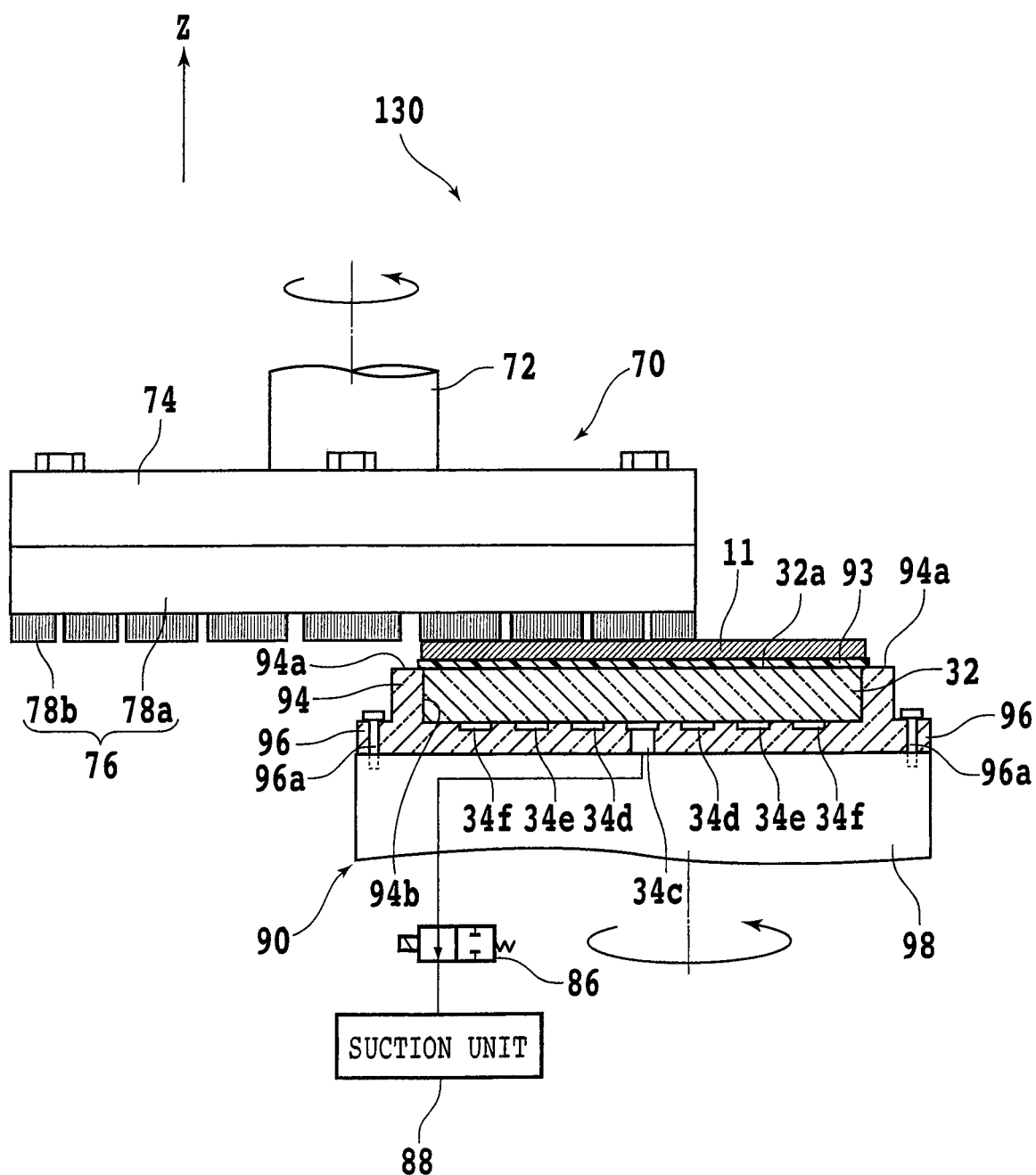
FIG. 15 is a side elevational view, partly in cross section, of a processing apparatus according to a third embodiment of the present invention.

A processing apparatus 130 (see FIG. 15) having the grinding unit 70 as a processing unit processing the workpiece 11 according to a third embodiment will be described below. FIG. 15 illustrates the manner in which the grinding unit 70 grinds the workpiece 11 held under suction on a porous chuck table 90 according to the third embodiment. FIG. 15 is a side elevational view, partly in cross section, of the processing apparatus 130 according to the third embodiment. The grinding unit 70 according to the present embodiment is identical to the grinding unit 70 described above with reference to FIG. 6 and will not be described in detail below. The porous chuck table 90 for holding the workpiece 11 under suction thereon is disposed in facing relation to the grinding unit 70. The porous chuck table 90 has a disk-shaped frame 94 mounted on an upper portion of a table base 98. The frame 94 is made of ceramics and has an annular flange 96 on an outer circumferential edge portion of the bottom of the frame 94. The annular flange 96 has a plurality of through screw holes defined therein that extend from upper to lower surfaces thereof.

The through screw holes are positioned at angularly spaced intervals circumferentially around the annular flange 96. According to the present embodiment, circumferentially adjacent ones of the through screw holes in the annular flange 96 are spaced from each other at circumferentially equal intervals when the frame 94 is viewed in plan. The table base 98 also has screw holes defined therein along an outer circumferential edge thereof at positions aligned with the through screw holes in the annular flange 96. The screw holes in the table base 98 are internally threaded and do not extend through the table base 98. Fasteners 96a such as screws are inserted through the through screw holes in the annular flange 96, and are threaded into the screw holes in the table base 98 and tightened to fasten the frame 94 to the table base 98. The porous chuck table 90 according to the present embodiment is different from the porous chuck table 30 according to the third embodiment where the frame 34 is held under suction on the table base 38 in that the frame 94 is fastened to the table base 98 by the fasteners 96a.

The material of the frame 94, the shape of a recess 94b defined in the frame 94, and the shape and layout of flow channels defined in the bottom of the frame 94 are identical to those in the frame 34 according to the first embodiment. A valve 86 and a suction unit 88 are identical to the valve 42 and the suction unit 44 according to the first embodiment. The porous plate 32 according to the first embodiment is disposed in the recess 94b in the frame 94. As with the first embodiment, the holding surface 32a of the porous plate 32 and a face side 94a of the frame 94 lie flush with each other. As illustrated in FIG. 15, the workpiece 11 is held under suction on the holding surface 32a with the protective tape 93 interposed therebetween. While the porous chuck table 90 and the grinding wheel 76 are being rotated about their own axes in the same direction, the grinding wheel 76 is lowered to press the grinding stones 78b against the workpiece 11 to grind the workpiece 11, thereby reducing the thickness of the workpiece 11. As described above, since the porous plate 32 of the porous chuck table 90 is made of glass particles 51, the holding surface 32a of the porous plate 32 is rendered flatter than if the porous plate 32 were made of ceramic particles, so that the suction force in the holding surface 32a can be made more uniform.

Figure 16:
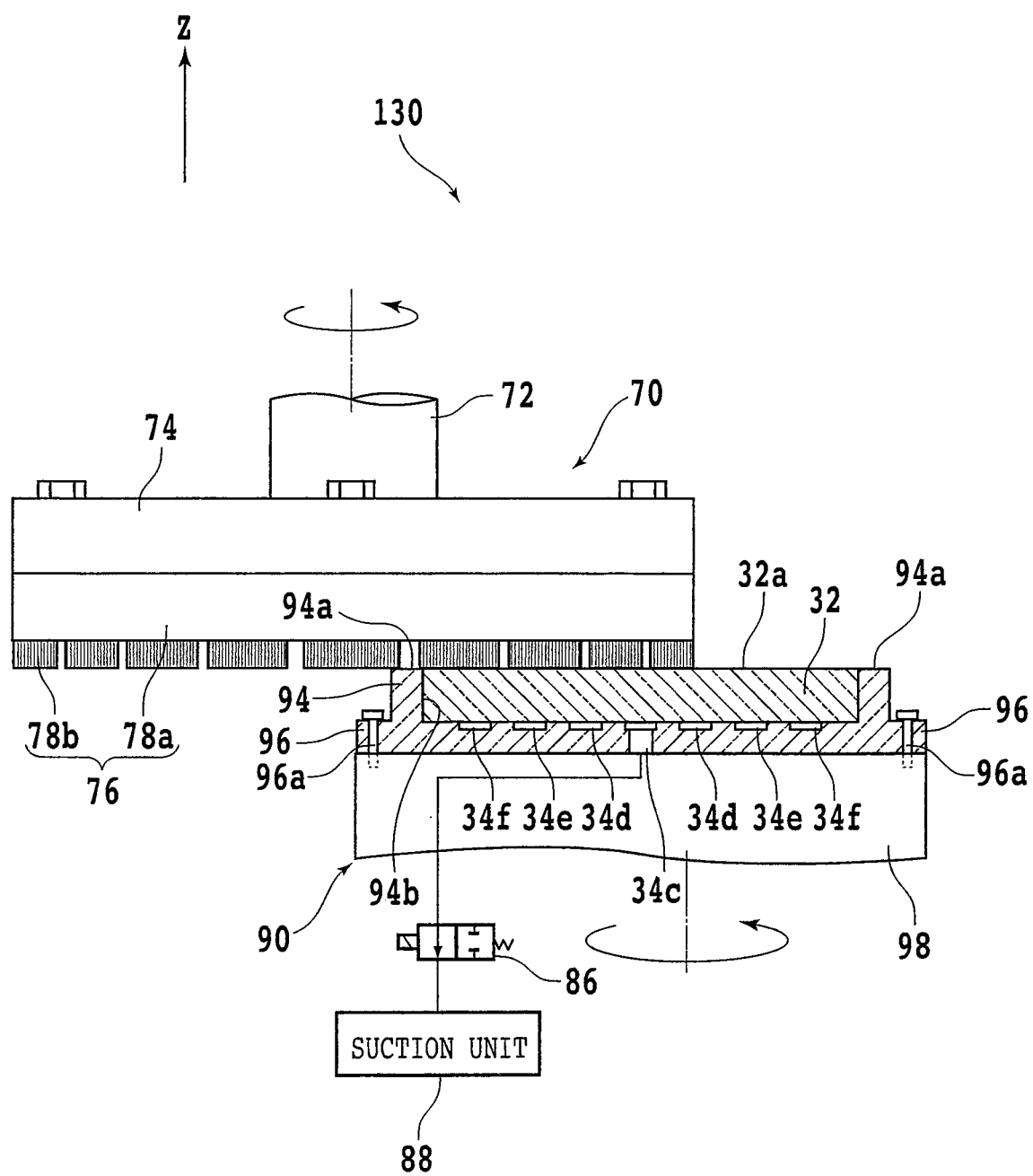
FIG. 16 is a side elevational view, partly in cross section, of the processing apparatus, illustrating the manner in which the processing apparatus is self-grinding a holding surface.

There are instances where the cutting unit 20 illustrated in FIG. 1 may cut into the holding surface 32a, making the holding surface 32a uneven or irregular. In such a case, or after the porous chuck table 90 is replaced with a new porous chuck table 90, it is necessary to grind, i.e., self-grind, the holding surface 32a to correct the holding surface 32a into a flat surface. FIG. 16 is a side elevational view, partly in cross section, of the processing apparatus 130, illustrating the manner in which the processing apparatus 130 is self-grinding the holding surface 32a. Since the porous plate 32 according to the present invention is made of glass particles 51 and the frame 34 is also made of glass, the grinding unit 70 that is used to grind the workpiece 11 can also be used to grind the holding surface 32a of the porous plate 32 and the face side 94a of the frame 94 with ease. In other words, the grinding unit 70 is capable of grinding the holding surface 32a with greater ease than grinding porous plates made of ceramics particles.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A porous chuck table for holding a workpiece under suction, comprising:
    a porous plate having a porous structure, the porous plate having a holding surface for holding the workpiece under suction thereon; and
    a frame surrounding the porous plate and having a face side lying flush with the holding surface,
    wherein the porous plate is completely made of spherical glass particles, and further wherein adjacent ones of the glass particles are partly joined together, and interstices between adjacent ones of the partly joined glass particles function as pores through which a fluid flows.

2. The porous chuck table according to claim 1, wherein the holding surface of the porous plate is flat.

3. The porous chuck table according to claim 1, wherein the glass particles have particle diameters selected in a predetermined range from 3 μm to 4 mm.

4. The porous chuck table according to claim 1, wherein the frame is made of glass.

5. The porous chuck table according to claim 1, wherein porosity of the porous plate represented by a ratio of a volume of the pores to the volume of the porous plate is in a range from 5% to 40%.

6. The porous chuck table according to claim 1, wherein the glass particles are made of a material that is capable of being sintered at a temperature between 700° C. and 800° C.

7. A processing apparatus comprising:
    a porous chuck table including
        a porous plate having a porous structure, the porous plate having a holding surface for holding a workpiece under suction thereon, and a frame surrounding the porous plate and having a face side lying flush with the holding surface, and
        the porous plate is completely made of spherical glass particles, and further wherein adjacent ones of the glass particles are partly joined together, and interstices between adjacent ones of the partly joined glass particles function as pores through which a fluid flows, and
    a processing unit processing the workpiece held on the porous chuck table.

8. The processing apparatus according to claim 7, wherein the processing unit is a cutting unit cutting the workpiece held on the porous chuck table with a cutting blade.

9. The processing apparatus according to claim 7, wherein the processing unit is a laser beam applying unit applying a laser beam to the workpiece held on the porous chuck table to process the workpiece.

10. The processing apparatus according to claim 7, wherein the processing unit is a grinding unit grinding the workpiece held on the porous chuck table with a grinding stone.

11. A porous chuck table for holding a workpiece under suction, comprising:
    a porous plate having a porous structure, the porous plate having a holding surface for holding the workpiece under suction thereon; and a frame surrounding the porous plate and having a face side lying flush with the holding surface, wherein the porous plate is made of spherical glass particles and fit comprised of a powder of glass particles, and further wherein adjacent ones of the glass particles are partly joined together with the frit therebetween, and interstices between adjacent ones of the partly joined glass particles function as pores through which a fluid flows.

12. The porous chuck table according to claim 11, wherein the holding surface of the porous plate is flat.

13. The porous chuck table according to claim 11, wherein the glass particles have particle diameters selected in a predetermined range from 3 μm to 4 mm.

14. The porous chuck table according to claim 11, wherein the frame is made of glass.

15. The porous chuck table according to claim 11, wherein porosity of the porous plate represented by a ratio of a volume of the pores to the volume of the porous plate is in a range from 5% to 40%.

16. The porous chuck table according to claim 11, wherein the glass of the frit and the glass of the spherical glass particles are the same glass material.

17. The porous chuck table according to claim 11, wherein the glass of the frit comprises a first glass material and the glass of the glass particles comprises a second glass material, and further wherein the first glass material has a lower melting point than that of the second glass material.

18. A processing apparatus comprising:
a porous chuck table including
a porous plate having a porous structure, the porous plate having a holding surface for holding a workpiece under suction thereon, and a frame surrounding the porous plate and having a face side lying flush with the holding surface, and the porous plate is at least made of spherical glass particles and fit comprised of a powder of glass particles, and further wherein adjacent ones of the glass particles are partly joined together with the fit therebetween, and interstices between adjacent ones of the partly joined glass particles function as pores through which a fluid flows, and a processing unit processing the workpiece held on the porous chuck table.

19. The processing apparatus according to claim 18, wherein the processing unit is a cutting unit cutting the workpiece held on the porous chuck table with a cutting blade.

20. The processing apparatus according to claim 18, wherein the processing unit is a laser beam applying unit applying a laser beam to the workpiece held on the porous chuck table to process the workpiece.

21. The processing apparatus according to claim 18, wherein the processing unit is a grinding unit grinding the workpiece held on the porous chuck table with a grinding stone.

22. The processing apparatus according to claim 18, wherein the glass of the fit and the glass of the spherical glass particles are the same glass material.

23. The processing apparatus according to claim 18, wherein the glass of the fit comprises a first glass material and the glass of the glass particles comprises a second glass material, and further wherein the first glass material has a lower melting point than that of the second glass material.

\* \* \* \* \*

UNITED STATES PATENT AND TRADEMARK OFFICE
CERTIFICATE OF CORRECTION

PATENT NO. : 11,315,822 B2
APPLICATION NO. : 16/456083
DATED : April 26, 2022
INVENTOR(S) : Setsuo Yamamoto It is certified that error appears in the above-identified patent and that said Letters Patent is hereby corrected as shown below:

In the Claims

In Column 20, Line 4, delete "fit" and insert --frit-- therefor.

In Column 20, Line 6, delete "fit" and insert --frit-- therefor.

In Column 20, Line 26, delete "fit" and insert --frit-- therefor.

In Column 20, Line 29, delete "fit" and insert --frit-- therefor.

Signed and Sealed this
Twenty-third Day of August, 2022

Katherine Kelly Vidal
*Director of the United States Patent and Trademark Office*